(12) United States Patent
Magome et al.

(10) Patent No.: US 6,677,088 B2
(45) Date of Patent: Jan. 13, 2004

(54) PHOTOMASK PRODUCING METHOD AND APPARATUS AND DEVICE MANUFACTURING METHOD

(75) Inventors: Nobutaka Magome, Saitama-ken (JP); Naomasa Shiraishi, Urawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/195,425

(22) Filed: Jul. 16, 2002

(65) Prior Publication Data

US 2002/0187406 A1 Dec. 12, 2002

Related U.S. Application Data

(63) Continuation of application No. 09/602,193, filed on Jun. 22, 2000, which is a continuation of application No. PCT/JP98/05912, filed on Dec. 25, 1998.

(30) Foreign Application Priority Data

| Dec. 25, 1997 | (JP) | ............................................. 9-356679 |
| Dec. 26, 1997 | (JP) | ............................................. 9-360027 |
| Feb. 6, 1998 | (JP) | ........................................... 10-025357 |

(51) Int. Cl.$^7$ ............................. G03F 9/00; G03C 5/00
(52) U.S. Cl. ............................. 430/5; 430/22; 430/30; 430/396; 430/394
(58) Field of Search ........................ 430/5, 30, 22, 430/396

(56) References Cited

U.S. PATENT DOCUMENTS

| 4,748,478 A | 5/1988 | Suwa et al. |
| 4,869,998 A | 9/1989 | Eccles et al. |
| 5,593,800 A | 1/1997 | Fujioka et al. |
| 6,171,736 B1 | 1/2001 | Hirayanagi |

FOREIGN PATENT DOCUMENTS

| JP | A-54-63680 | 5/1979 |
| JP | 54-063680 | 5/1979 |
| JP | A-2143513 | 6/1990 |
| JP | 2-143513 | 6/1990 |
| JP | A-2-144535 | 6/1990 |
| JP | 2-144535 | 6/1990 |
| JP | 4-252016 | 9/1992 |
| JP | A-4-252016 | 9/1992 |
| JP | 6-132206 | 5/1994 |
| JP | A-7-37801 | 2/1995 |
| JP | 7-037801 | 2/1995 |
| JP | A-10-90874 | 4/1998 |
| JP | 10-090874 | 4/1998 |

*Primary Examiner*—Mark F. Huff
*Assistant Examiner*—Saleha Mohamedulla
(74) *Attorney, Agent, or Firm*—Oliff & Berridge, PLC

(57) ABSTRACT

A photomask producing method according to the present invention segments a parent pattern which is an α-magnification of an original pattern which is a β-magnification of a circuit pattern into α lengthwise and breadthwise, thereby forming parent patterns on data. The parent patterns are written on a substrate at equal magnification by using an electron beam lithography system, thereby producing master reticles. Reduced images of the parent patterns of the master reticles are transferred on a substrate while performing screen linking, thereby producing working reticle. This photomask producing method can form an original pattern with a high precision and in a short period of time.

34 Claims, 15 Drawing Sheets

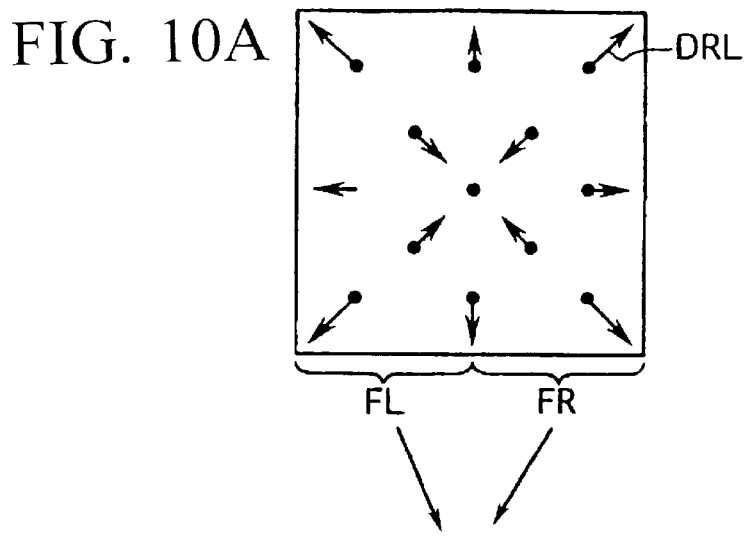
FIG. 10A
FIG. 10B
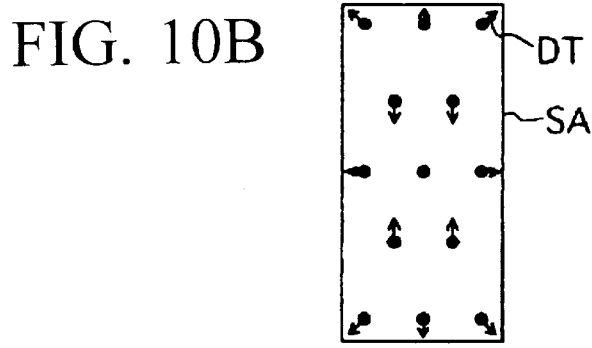
FIG. 11A
FIG. 11B
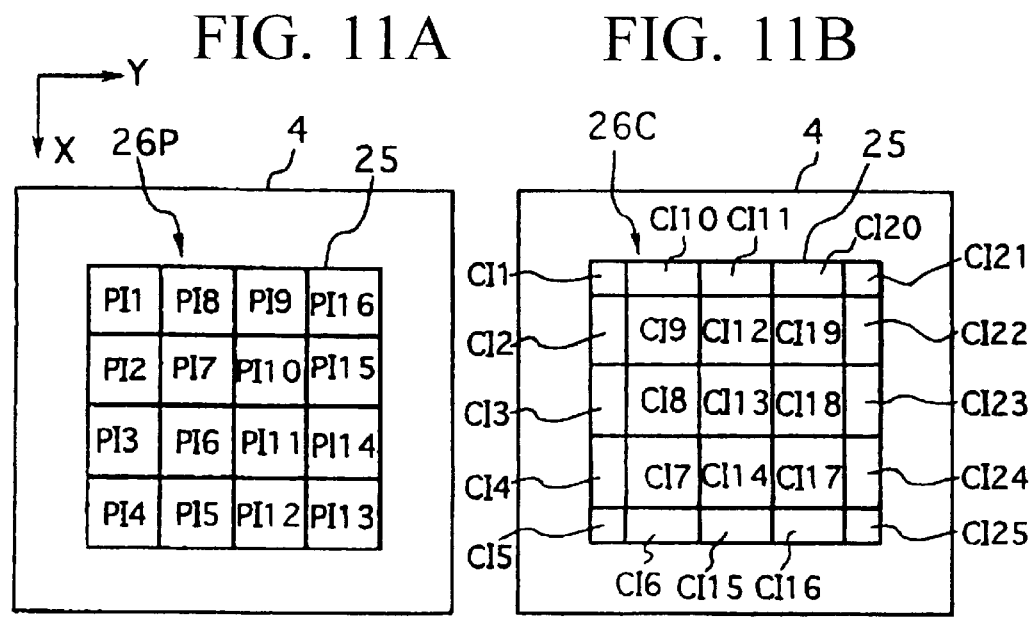

PHOTOMASK PRODUCING METHOD AND APPARATUS AND DEVICE MANUFACTURING METHOD

This is a Continuation of application Ser. No. 09/602,193 filed Jun. 22. 2000, which in turn is a Continuation of application No. PCT/JP98/05912, filed Dec. 25. 1998. The entire disclosure of the prior applications is hereby incorporated by reference herein in its entirety.

TECHNICAL FIELD

The present invention relates to a method and apparatus for producing a photomask which is used as an original pattern at the time of fabricating micro devices, such as semiconductor integrated circuits, image pickup devices (CCDs or the like), liquid crystal display devices or thin-film magnetic heads, by using lithographic technology. This invention also relates to a method of manufacturing a device which uses such a photomask producing method.

BACKGROUND ART

At the time of manufacturing devices, such as semiconductor integrated circuits, a transfer system is employed which uses a photomask on which an original pattern that is a to-be-formed circuit pattern enlarged by, for example, about 4 to 5 times, and performs reduction projection of the original pattern of this photomask on a substrate to be exposed, such as a wafer or a glass plate, via a reduction projection optical system. An exposure system is used at the time of transferring the pattern of such a photomask and a photomask which is used by a reduction projection exposure apparatus of a step and repeat type is also called a "reticle".

Conventionally, such photomasks have been produced by writing an original pattern on a predetermined substrate (blank) by using an electron beam lithography system or a laser beam lithography system. That is, after a mask material (light-shielding film) is formed on the substrate and a resist is coated thereon, the original pattern is written by using an electron beam lithography system or a laser beam lithography system. Thereafter, the resist is developed and etching or the like is performed to form the original pattern of that mask material. In this case, given that the reduction magnification of a reduction projection exposure apparatus which uses the photomask is $1/\beta$, the original pattern that is written on the photomask can be a pattern which is the pattern of the device enlarged by $\beta$, so that a writing error by the lithography system is reduced to nearly $1/\beta$ on the device. Therefore, it is possible to substantially form the pattern of a device with a resolution that is approximately $1/\beta$ times the resolution of the lithography system.

As described above, conventionally, the original pattern of a photomask has been written by an electron beam lithography system or a laser beam lithography system. Those lithography systems write the original pattern directly based on write data from a control computer. Because the areas of devices, such as recent LSIs, are getting larger, and the miniaturization scale and integration are constantly being improved, however, the original patterns of photomasks which are needed for exposure are becoming larger in area and becoming more miniaturized. While a reticle, used in double exposure, provided with a correction pattern for preventing an unnecessary pattern from being transferred, and a so-called phase shift reticle having a phase shifter provided between adjoining patterns, etc. are used as photomasks, those special photomasks tend to have a larger amount of write data than other photomasks. Because of these reticles, the amount of write data that is needed by a lithography system for producing a photomask becomes enormously large.

Therefore, the writing time required for the lithography system to write the original pattern of a single photomask recently has become 10 to 24 hours. Such increased writing times are factor in raising the manufacturing cost for photomasks.

With regard to the above, an electron beam lithography system needs to correct the proximity effect caused by the influence of scattering specific to an electron beam, and also needs to correct an uneven electric field around the substrate which is caused by charging on the surface of the substrate. To write an original pattern as designed, therefore, it is necessary to measure in advance the error of the writing position or the like under various conditions and keep performing complex correction with high precision and stability at the time of writing. It is, however, difficult to keep performing complex correction with high precision and stability, and there has been a problem of drifting of the writing position during writing. Writing may be interrupted to carry out calibration, which inconveniently makes the overall writing time longer.

When the miniaturization of pattern rules for semiconductor devices or the like advances further, therefore, the writing time for the original pattern of a single photomask will becomes too long, resulting in a variation in precision, so that the required writing precision may not be achieved. Further, the amount of write data in a control computer is becoming so large that it is difficult to use the data in single writing.

A laser beam lithography system writes an original pattern using a laser beam in the ultraviolet range and has the advantages of being able to use a resist having a higher resolution as compared with the electron beam lithography system and is free of the scatter-originated proximity effect. But, the resolution of the laser beam lithography system is lower than that of the electron beam lithography system. As the laser beam lithography system also directly writes an original pattern, the amount of write data is becoming so large as to make data processing difficult and the writing time becomes considerably long so that the required writing precision may not be achieved due to drifting of the writing position or the like.

Although a predetermined pattern may be transferred on a substrate for a photomask by using an optical projection exposure apparatus at the time of producing the original pattern of that photomask, the accuracy of the original pattern gets lower if there is a distortion in the projection optical system which is used in the execution of that transfer, a variation in the evenness of the width of the transfer line, or the like.

When a photomask is actually mounted on a projection exposure apparatus and as original pattern of that photomask is projected on a substrate, such as a wafer, via a projection optical system, there occurs the problem of exposing a deformed image on the substrate, causing an overlap error or the like, if a distortion or the like remains in the projection optical system. Because the image forming characteristics, such as any distortion of the projection optical system, slightly differs from one projection exposure apparatus to another, it is desirable to be able to correct a projection image for each projection exposure apparatus if possible.

By the way, the recent trend in the market of semiconductor integrated circuits is change towards multi-type, small quantity production type devices, called ASICs (Application Specific ICs) or system LSIs, and the demanded delivery period from the acceptance of an order for the production of such devices to the delivery is becoming very short. In manufacturing such types of devices, therefore, it is necessary to first produce a photomask (working reticle) on which the original pattern for manufacturing the devices is formed in a short period of time and then produce the devices in a short period of time by using this photomask.

State-of-the-art devices are completed through, for example, more than 20 exposure steps, and the production of even one type of devices require about the same number of photomasks as the number of exposure steps. Further, the processing performance of the aforementioned laser beam lithography system or electron beam lithography system per unit time is low, so that writing a single photomask takes more than a day in some cases. Conventionally, the original patterns of all the photomasks to be used to produce one type of devices have been written, therefore, the overall time required was considerably long and it has been difficult to shorten the production time for one type of device.

Further, because the overall writing time has been very long, the production cost for photomasks to be used in manufacturing one type of device are very high, resulting in a high production cost for the devices.

Furthermore, the types of such devices are so varied that it is becoming difficult to write the original patterns of all the photomasks to be produced, by using a laser beam lithography system or an electron beam lithography system in terms of time limitations.

DISCLOSURE OF INVENTION

It is a first object of the present invention to provide a photomask producing method which can form an original pattern within a short period of time.

It is a second object of this invention to provide a photomask producing method capable of substantially correcting a predetermined image forming characteristic of an image projected by a projection exposure apparatus which uses a photomask when the image forming characteristic is degraded.

It is a third object of this invention to provide a photomask producing method capable of substantially correcting a predetermined image forming characteristic of a projection optical system for use in a projection exposure apparatus, which is used in producing photomasks, when the image forming characteristic is degraded.

It is a fourth object of this invention to provide a photomask producing method capable of producing photomasks, which can be used in producing multi-type small-quantity production types of devices, such as ASICs and system LSIs, in a short period of time and at a low cost.

It is a fifth object of this invention to provide a manufacturing device which can implement such a photomask producing method.

It is a sixth object of this invention to provide a device manufacturing method capable of forming the pattern of a device with a high accuracy by using such a photomask producing method.

It is a seventh object of this invention to provide a device manufacturing method which can manufacture multi-type and small-quantity production type devices in a short period of time by using such a photomask producing method.

To achieve such objects, a first photomask producing method according to this invention, which produces a photomask (34) having a transfer pattern (27) formed, segments an enlarged pattern of the transfer pattern (27) into patterns of plural parent masks (R1 to RN); and sequentially transfers reduced images of the patterns of the plural parent masks (R1 to RN) onto the surface of a substrate (4) for the photomask by performing screen linkage (e.g. seamless stitching exposure, etc.).

According to this invention, at the time of producing a photomask, as one example, a thin film of a mask material is formed on a photomask substrate (4) and a photosensitive material such as a photoresist is coated on the film. Then, after reduced images of a plurality of parent masks are transferred on a photosensitive material by a step and repeat system or a step and scan system using, for example, an optical and reduction projection type exposure apparatus, the photosensitive material is developed. Then, a desired transfer pattern (original pattern) is formed by executing etching or the like with the pattern of the remaining photosensitive material as a mask.

At this time, given that the reduction magnification of, for example, an optical exposure system for producing a photomask is $1/\alpha$ ($\alpha$ being an integer, a half integer or the like greater than 1), a transfer pattern (27) or an original pattern is enlarged by $\alpha$ and this enlarged parent pattern (36) is segmented into patterns of $\alpha \times \alpha$ parent masks lengthwise and breadthwise. As a result, the pattern which is formed on each parent mask is a part of a parent pattern which is an original pattern enlarged by $\alpha$, so that the amount of write data of the pattern of each parent mask is reduced to about $1/\alpha^2$ of the conventional amount and the minimum line width becomes $\alpha$ times the conventional width. Therefore, the pattern of each parent mask can be written with a high precision and less drift in a short period of time by using, for example, a conventional electron beam lithography system or laser beam lithography system. Further, the writing error of the lithography system is reduced to $1/\alpha$ on a photomask and the accuracy of the original pattern is further improved. Further, once those parent masks are produced, the patterns of the parent masks can be transferred quickly on a photomask substrate by a step and repeat system or the like, so that the production time for producing a plurality of photomasks, particularly, can be shortened significantly as compared with the conventional system that writes them individually by a lithography system.

The term "screen linkage" means linking different areas on an object onto which patterns are transferred to form a device pattern in the linked areas on the object by exposure of the different areas, and the exposure operation to link the different areas on the object is called "stitching exposure" (step and stitch type). The term "screen linkage" (stitching exposure) in this specification includes not only the meaning that individual reduced images of parent masks obtained by segmenting a single pattern are linked together to complete the single pattern to be transferred to a photomask, but also means that a plurality of parent masks are formed without segmenting a single pattern and the individual reduced images of those parent masks are linked together to complete a photomask having a plurality of patterns. In short, the term "screen linkage" (stitching exposure) in this specification is used to simply mean the linkage of the individual reduced images of parent masks together, regardless of whether or not a single pattern is formed by linking screens (stitching exposure). In the case of forming, for example, a photomask having a plurality of patterns, therefore, possible ways for the segmentation for parent masks include the segmentation of one of the patterns into a plurality of parent masks and the segmentation into a plurality of parent masks without segmenting each pattern. The former case is advantageous in that the shapes (sizes) of parent masks can be made uniform, and the latter case is advantageous in that there is no pattern joint so that defects such as improper linkage do not occur.

Next, a second photomask producing method according to this invention, which produces a photomask (34) on which a transfer pattern is formed, segments the transfer pattern (27) or an enlarged pattern (36) thereof into N sets (N being an integer equal to or greater than 2) of patterns of plural parent masks (R1 to RN, Q1 to QN); and sequentially transfers reduced images of the N sets of patterns of plural parent masks onto the surface of a substrate (4) for the photomask while performing screen linkage (stitching exposure).

According to this invention, at the time of producing a photomask, as one example, a thin film of a mask material is formed on a photomask substrate (4) and a photosensitive material such as a photoresist is coated on the film. Then, after the images (or reduced images) of N sets of plural parent masks are transferred, one on another, on a photosensitive material by a step and repeat system or a step and scan system using, for example, an optical and reduction projection type exposure apparatus, the photosensitive material is developed. Then, a desired transfer pattern (original pattern) is formed by executing etching or the like with the pattern of the remaining photosensitive material as a mask.

At this time, multiple exposures of the patterns of N sets of parent masks allow the writing error of the patterns of the parent masks to be averaged by the number of multiple exposures, making it possible to significantly reduce the line width error, positional error or the like of a transfer pattern (original pattern) on a photomask. Further, once those parent masks are produced, the patterns of the parent masks can be transferred quickly on a photomask substrate by a step and repeat system or the like, so that the production time for producing a plurality of photomasks, particularly, can be shortened significantly as compared with the conventional system that writes them individually by a lithography system.

Given that for example, an optical exposure system for producing a photomask provides $1/\alpha$ reduction projection, a transfer pattern (27) is enlarged by $\alpha$ and this enlarged parent pattern (36) is segmented to patterns of one set of $\alpha \times \alpha$ parent masks lengthwise and breadthwise. Likewise, the pattern of a parent mask in another set is a part of its enlarged segmented parent pattern (36). Consequently, as in the above-described first photomask producing method, the amount of write data of the pattern of each parent mask is reduced to about $1/\alpha^2$ of the conventional amount and the minimum line width becomes $\alpha$ times the conventional width. Therefore, the pattern of each parent mask can be written with a high precision and less drift in a short period of time by using, for example, a conventional electron beam lithography system or laser beam lithography system. Further, the writing error of the lithography system is reduced to $1/\alpha$ on a photomask and the accuracy of the original pattern is further improved.

In this case, one example of the patterns of N sets of plural parent masks are a plurality of patterns segmented from the transfer pattern or an enlarged pattern thereof in the same arrangement. Multiple exposures of the pattern images of parent masks that are segmented in the same arrangement this way allow the writing error of the lithography system for writing those parent masks to be averaged and become smaller.

It is desirable that a segmenting method for at least one set of patterns of plural parent masks (BI1 to BI26) in the N sets of patterns of plural parent mask patterns should differ from that for another predetermined set of patterns of plural parent masks (PI1 to PI26). With the segmenting method changed this way, pattern images to be subjected to multiple exposures on the photomask substrate undergo multiple exposures at different positions in the exposure area of the projection optical system which projects the pattern images of their parent masks. Therefore, the distortion of the projection optical system and errors in the evenness of the width of the transfer line at a position in the exposure area are averaged and the precision of the patterns of the photomasks is improved.

It is desirable that at least one set of patterns of plural parent masks in the N sets of patterns of plural parent masks should include a linkage area for another predetermined set of patterns of plural parent masks. Accordingly, linkage errors at the time of performing stitching exposure while performing screen linkage is averaged and is reduced.

Next, a third photomask producing method according to this invention, which produces a photomask having a device pattern, transfers one (P1 to PN) of a plurality of segment patterns segmented from an enlarged pattern of the device pattern onto a mask substrate (4), and transfers another segment pattern (A1 to AN) which is the same as the one segment pattern at least partially on the mask substrate (4) in such a way that the same portions overlap each other.

According to this invention, provided that those segment patterns are to be written by an electron beam lithography system or the like, the writing error of two segment patterns is averaged by exposing two segment patterns, one on the other, so that the accuracy of the device pattern is improved. Further, as those segment patterns can be repeatedly used by a step and repeat system or the like, multiple photomasks can be produced at a high speed.

In this case, it is desirable that the plurality of segment patterns should be exposed with a light beam and their reduced images should be transferred and linked together, on a predetermined mask substrate (4). This reduction projection decreases the writing error of those segment patterns on the photomask, so that the precision of the device pattern is improved.

It is also desirable that at the time of sequentially transferring reduced images of patterns of the plural parent masks (R1 to RN) on the surface of the substrate (4), a reduction projection exposure apparatus of a static exposure type or a reduction projection exposure apparatus of a scanning exposure type should be selectively used in accordance with the use of the photomask (the system of the exposure apparatus to be used or the like). When the photomask is used in a reduction projection exposure apparatus of a scanning exposure type, such as a step and scan system, distortion of a parallelogram shape (so-called skew error) may occur in a projected image. In this case, it is difficult to correct a skew error in a static exposure type, so that at the time of transferring patterns of a plurality of parent masks on the substrate for the photomask, the distortion at the time the photomask is used can be reduced by adding such a distortion as to cancel out the skew error by using a projection exposure apparatus of a scanning exposure type. This makes the overlapping error or the like smaller.

Further, it is desirable that at the time of sequentially transferring patterns (or reduced images of patterns) of the plural parent masks (R1 to RN) on the surface of the substrate (4), each of the image forming characteristics (transfer position, magnification, distortion, etc.) of the reduced images of the patterns of the parent masks should be corrected in accordance with at least one of the rotational asymmetric aberration and the distortion characteristics of the projection optical system (42) of a projection exposure apparatus which uses the photomask.

If the amount of a variation in a predetermined image forming characteristics of an exposure system which uses a photomask is known in advance, the distortion or the like of a device pattern to be exposed finally using the photomask becomes smaller and the overlapping precision or the like is improved by adjusting the transfer position, magnification and also distortion or the like of the pattern images of the individual parent masks in such a way as to cancel out the amount of variation in the image forming characteristics at the time of transferring the pattern images of the individual parent masks on the substrate for a photomask while performing screen linkage (stitching exposure).

With regard to that, there may be a case where multiple photomasks are produced and those photomasks are used in a plurality of projection exposure apparatuses by a mix and match system or the like. In this case, it is desirable to adjust the transfer position or the forming characteristic or the like at the time of transferring the patterns of the individual parent masks, linked together, in accordance with the average characteristic of the distortion characteristic or the like of projection images of at least two predetermined projection exposure apparatuses which use those photoresists, so that the individual projection exposure apparatuses can acquire excellent overlapping precision.

Next, it is desirable that a photomask be further used in reduction projection. Assuming that a photomask is used in reduction projection of, for example, $1/\beta$ ($\beta$ being an integer, a half integer or the like greater than 1) and the reduction magnification of an exposure system for producing a photomask is $1/\alpha$ ($\alpha$ which, like $\beta$, is an integer, a half integer or the like greater than 1), the writing error of the patterns of the individual parent masks is reduced to $1/(\alpha \cdot \beta)$ on a device pattern to be finally exposed. Even if the minimum line width of the device pattern is set to ½ of the current width, therefore, it is possible to write patterns (segment patterns) of the individual parent masks with the required accuracy easily and in a short period of time by using an electron beam lithography system or a laser beam lithography system or the like. Even when the pattern rules are miniaturized further, therefore, a desired device pattern can be exposed with the needed precision.

A part of those parent masks (segment patterns) may be used as a phase shift reticle or the like. Further, it is desirable to optimize the image forming characteristic for each parent mask.

A fourth photomask producing method according to this invention, which produces a photomask (WR) having a predetermined transfer circuit pattern formed, forms a parent mask (MR1) formed with a predetermined pattern including one or a plurality of pattern units (Pa, PB, Pc) respectively corresponding to one or a plurality of circuit blocks in the transfer circuit pattern; and transfers a projection image of the pattern unit selected from a pattern of the parent mask (MR1) on a substrate (50) for the photomask (WR) in a predetermined positional relation.

According to this invention, in the case of producing photomasks (working reticles) for plural types of devices of multi-type small-quantity production type, such as so-called ASICs and LSIs, the photomasks should be produced for each type. However, not all of the to-be-transferred patterns (patterns of working reticles) for those plural types of devices differ type by type but they often have common circuit blocks, such as a CPU section and RAM section, even among different types of device. Even different types of devices, which do not have a CPU section or RAM section, typically have some kind of common circuit blocks (small-scale circuit units) which are smaller in scale than the CPU section or the like.

According to the fourth photomask producing method of this invention, therefore, a pattern unit corresponding to a predetermined circuit block in a pattern to be formed on a photomask is formed in advance. Then, a mask material is formed on a substrate (50) for that photomask and a photosensitive material is coated on that mask material. After that, the projection image of the corresponding pattern unit in that parent mask is transferred to a position on that substrate where the circuit block is to be formed, and at other portions, corresponding patterns are transferred or written. Then, the photosensitive material is developed and etching or the like with the remaining photosensitive material as a mask is carried out. Accordingly, the photomask is produced in a short period of time and thus at a low cost.

In this case, as one example, the circuit block corresponds to one of a CPU core section, RAM section and ROM section in an integrated circuit and standard circuit block for a standard cell. In general, ASICs or the like often commonly have a CPU section or a RAM section or the like, so that parent masks according to this invention can be commonly used at the time of producing photomasks (working reticles) that are used in manufacturing many types of devices and can thus reduce the manufacturing cost of each device.

It is desirable that as the parent mask, plural parent masks (MR1, MR2) should be prepared on which different pattern units (Pa, Pf) respectively corresponding to different circuit blocks in the transfer circuit pattern are formed; and projection images of the pattern units selected from patterns of the plural parent masks should sequentially be transferred on the substrate (50) for the photomask in a predetermined positional relation. This transfer of a combination of the projection images of the pattern units of plural parent masks can manufacture many types of devices in a short period of time using fewer parent masks as a whole.

That is, it is desirable that the parent mask (MR1) be used at the time of producing plural types of photomasks (WR, WR1). This can shorten the production period for each photomask and can thus reduce the production cost.

For devices such as a new type of ASIC, parent masks (master reticles) having new circuit portions should newly be produced. Because the patterns of most of the circuit blocks of such a new type of devices are formed by exposure and transfer of pattern units of existing parent masks and the number of pattern units that should be written on new parent masks can be small, it is possible to considerably shorten the production time and cost for photomasks for the new type of devices.

It is also desirable that the reduced image of the pattern unit of the parent mask should be transferred on the substrate for the photomask; and the photomask should be further used in reduction projection. When the pattern of a parent mask is used in reduction projection of, for example, $1/\alpha$ ($\alpha$ being 4 or 5 or the like, for example), the writing error of the pattern of the parent mask on the photomask also becomes $1/\alpha$ as mentioned above. In writing the pattern to that parent mask, therefore, it is possible to use a lithography system, such as a laser beam lithography system, which has a higher throughput than that of an electron beam lithography system. As the photomask is used in further reduction projection, the influence of the writing error of the pattern of that parent mask is further reduced, making it possible to manufacture finer devices with a high accuracy.

Further, by using an exposure beam stopped down to a predetermined spot, a part of the transfer circuit pattern may be written on the substrate for the photomask at at least a part of an area other than where the image of the pattern unit of the parent mask is transferred. The pattern of that photomask may include lines for connecting basic pattern units or a small-scale pattern or the like specific to each device. It is troublesome in some cases to produce a mask which has such lines and small-scale patterns or the like as new pattern units. In such a case, the production times for various kinds of photomasks can be shortened and the production costs can be decreased by forming only the lines and small-scale pattern by writing with a laser beam or the like.

Next, a photomask producing apparatus according to this invention comprises a mask retaining unit (16 to 18) for retaining a plurality of masks (R1 to Rn); a mask stage (2) on which a mask selected from the mask retaining unit is placed; a projection optical system (3) for projecting a reduced image of a pattern of the mask on the mask stage onto a substrate (4) for a photomask; a substrate stage (6) for positioning the substrate on a plane perpendicular to an optical axis of the projection optical system; and an alignment system (14A, 14B) for aligning the mask on the mask stage (2) with the substrate on the substrate stage (6) in order to transfer reduced images of patterns of the predetermined masks on the substrate, shifted from one another.

The use of this photomask producing apparatus can implement the photomask producing method of this invention.

In this case, as one example, the mask retaining unit retains plural parent masks (R1 to RN) on which segmented patterns of an enlarged pattern of a pattern (27) of a photomask to be produced are formed. Accordingly, those parent masks can be exchanged at a high speed and exposure can be carried out in a short period of time.

Further, it is desirable that this photomask producing apparatus should comprise a view field selecting system (104) for selecting a pattern of a predetermined shape at an arbitrary position in the patterns of the masks and projecting a reduced image of the selected pattern by the projection optical system on the substrate (50) for the photomask; and the alignment system (109A, 109B, FM1) aligns the mask with the substrate on the substrate stage in order to transfer the reduced image selected by the field view selecting system on the substrate in a predetermined positional relation.

Further, it is desirable that the producing apparatus should be provided with an exposure beam irradiation system (LA1, AM1, 121, 120) for irradiating an exposure beam (laser beam, electron beam or the like) stopped down to a spot on a desired portion on that substrate. A circuit pattern such as lines which is not appropriate for transfer from that mask can easily be formed by writing with an exposure beam.

A method of manufacturing a device for forming a predetermined pattern on a substrate (W), according to this invention, segments a second pattern (36) obtained by further enlarging an enlarged first pattern (27) of the predetermined pattern into patterns of plural parent masks (P1 to PN); produces a photomask (34) for real exposure formed with the first pattern (27) by performing reduction projection of the patterns of plural parent masks on a predetermined substrate (4), sequentially shifting their positions from one to another; and transfers a reduced image of a pattern of the photomask for real exposure on the substrate (W).

According to this invention, assuming that the magnification from the pattern of a device to be formed on the substrate (W) to the first pattern (27) is β (β being an integer, a half integer or the like greater than 1) and the magnification from the first pattern to the second pattern (36) is α (α which, like β, is an integer, a half integer or the like greater than 1), the line width of the patterns of those parent masks becomes α·β of the line width of the patterns of the device. If the writing error of the line width at the time of writing the patterns of those parent masks with an electron beam lithography system or the like is Δd, therefore, the error of the line width of the patterns of the device is reduced to approximately Δd/(α·β), so that the patterns of the device can be formed with an extremely high precision.

With regard to the device manufacturing method, it is preferable that the second pattern (36) of the parent mask should be segmented to N sets (N being an integer equal to or greater than 2) of plural patterns (P1 to PN, Q1 to QN); and the photomask (34) for real exposure formed with the first pattern (27) should be produced by performing reduction projection of the N sets of patterns of plural parent masks on a predetermined substrate (4) while sequentially performing screen linkage (stitching exposure).

Accordingly, as the reduced images of N sets of patterns of parent masks are transferred, overlapped one on another, the averaging effect reduces the effect of the writing errors of the lithography system and the distortion or the like of the projection optical system for performing reduction projection of patterns of parent masks.

Next, a method of manufacturing a device for forming a predetermined circuit pattern on a substrate, according to this invention, forms a pattern unit (pa) corresponding to at least one circuit block in an enlarged first circuit pattern of the predetermined circuit pattern on a parent mask (MR1); produces a photomask (MR) for real exposure formed with the first circuit pattern by transferring the pattern unit of the parent mask on a predetermined substrate (50) in a predetermined positional relation; and transfers the reduced image of a pattern of the photomask for real exposure on a substrate (W) for the device.

BRIEF DESCRIPTION OF DRAWINGS

FIG. 10 is a diagram for explaining that distortion is reduced by exposing images at different positions in the exposure area of a projection optical system, overlapping one another at the same position;

FIG. 11A is a plan view illustrating the reduced images of a first set of parent patterns to be exposed on the substrate 4 according to a further example of the embodiment and FIG. 11B is a plan view illustrating the reduced images of a second set of parent patterns to be placed thereon;

FIG. 13A is a plan view depicting a first master reticle, FIG. 13B is a plan view depicting a second master reticle, FIG. 13C is a plan view depicting a first working reticle and FIG. 13D is a plan view depicting a second working reticle;

BEST MODES FOR CARRYING OUT THE INVENTION

Preferred embodiments of the present invention will now be described with reference to the accompanying drawings.

First Embodiment

The first embodiment of this invention will now be described with reference to the accompanying drawings.

Figure 1:
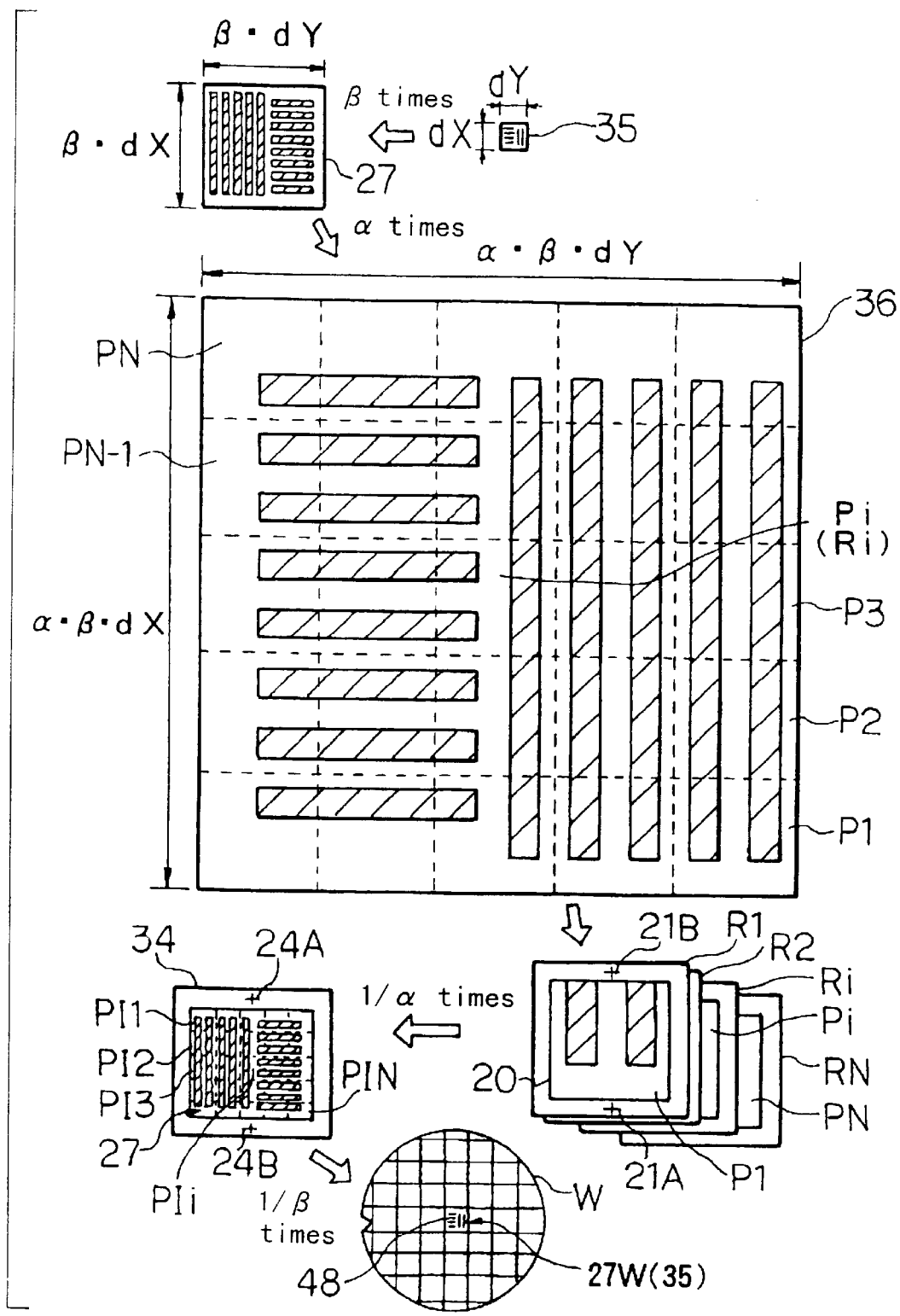
FIG. 1 is a diagram for explaining the production steps for a working reticle (photomask) as an embodiment of this invention.

FIG. 1 is a diagram illustrating production steps for a photomask according to the first embodiment of this invention. In FIG. 1, a photomask to be produced is a working reticle 34 which is used at the time of actually manufacturing a semiconductor device. This working reticle 34 has an original pattern 27 for transfer formed of chromium (Cr), molybdenum silicide ($MoSi_2$ or the like) or another mask material on one surface of a transmission substrate of quartz glass or the like. Two alignment marks 24A and 24B are formed in such a way as to sandwich the original pattern 27.

Further, the working reticle 34 is used in reduction projection of $1/\beta$ ($\beta$ is an integer, a half integer or the like greater than 1, and is 4, 5 or 6 or the like as one example) via the projection optical system of an optical projection exposure apparatus. That is, in FIG. 1, after a reduced image 27W which is $1/\beta$ times the original pattern 27 of the working reticle 34 is exposed in each shot area 48 on a wafer W on which a photoresist is coated, developing and etching or the like are carried out to form a predetermined circuit pattern 35 on each shot area 48. In this embodiment, the image forming characteristics of a projection image of the projection exposure apparatus, such as the non-rotational symmetric aberration and distortion characteristics, are pre-measured and the measuring results are used at the time of producing the working reticle 34 as will be discussed later. The following discusses the first embodiment of a method of producing the working reticle 34 as a photomask.

In FIG. 1, the circuit pattern 35 of a layer of the finally produced semiconductor device is designed. The circuit pattern 35 has various line and space patterns or the like formed in a rectangular area whose perpendicular sides have widths of dX and dY. In this example, the circuit pattern 35 is magnified by $\beta$ to form the original pattern 27, which has a rectangular area whose perpendicular sides have widths of $\beta \cdot dX$ and $\beta \cdot dY$, on image data on a computer. $\beta$ is the reciprocal of the reduction projection magnification ($1/\beta$) of the projection exposure apparatus which uses the working reticle 34. When the projection exposure apparatus which uses the working reticle 34 projects its reduced inverted image, the circuit pattern 35 is also inverted and enlarged to acquire the original pattern 27.

Next, the original pattern 27 is magnified by $\alpha$ ($\alpha$ being an integer, a half integer or the like greater than 1, and 4, 5 or 6 or the like as one example) to form a parent pattern 36, which has a rectangular area whose perpendicular sides have widths of $\alpha \cdot \beta \cdot dX$ and $\alpha \cdot \beta \cdot dY$, on image data, and the parent pattern 36 is divided into $\alpha$ segments lengthwise and breadthwise, thereby forming $\alpha \times \alpha$ parent patterns P1, P2, P3, ..., PN ($N = \alpha^2$) of image data. FIG. 1 shows the case where $\alpha = 5$. The number of segments, $\alpha$, of this parent pattern 36 does not necessarily coincide with the magnification $\alpha$ of the original pattern 27 to the parent pattern 36. Thereafter, write data for an electron beam lithography system (or a laser beam lithography system also usable) is produced from those parent patterns Pi (i=1 to N), and the parent patterns Pi are transferred in equal magnification to a master reticle Ri as a parent mask.

In producing the first master reticle R1, for example, a thin film of a mask material, such as chromium or molybdenum silicide, is formed on the transmission substrate of quartz glass or the like, an electron beam resist is coated on this film, then an equal-magnification image of the first parent pattern P1 is written on the electron beam resist using the electron beam lithography system. Thereafter, the electron beam resist is developed, and etching and resist separation or the like are carried out, thus forming the parent pattern P1 in a pattern area 20 on the master reticle R1. At this time, two alignment marks 21A and 21B comprised of two-dimensional marks should be formed on the master reticle in a predetermined positional relation to the parent pattern P1. Likewise, the parent patterns Pi and the alignment marks 21A and 21B are formed on other master reticles Ri by using the electron beam lithography system or the like. The alignment marks 21A and 21B are used for positional alignment at the time of screen linkage (stitching exposure).

According to this embodiment, as apparent from the above, each parent pattern Pi which is written by the electron beam lithography system (or laser beam lithography system) is the original pattern 27 enlarged by α, so that the amount of each write data is decreased to about $1/\alpha^2$ as compared with the case where the original pattern 27 is directly-written. Further, because the minimum line width of the parent pattern Pi is α times (e.g., 5 times or 4 times or the like) the minimum line width of the original pattern 27, each parent pattern Pi can be written in a short period of time and with a high precision by an electron beam lithography system using the conventional electron beam resist. Furthermore, once N master reticles R1 to RN are produced, then the necessary number of working reticles 34 can be produced by repeatedly using them as will be discussed later, so that the time for producing the master reticles R1 to RN is not a heavy burden.

That is, the working reticle 34 is produced by transferring reduced images PIi (i=1 to N) which are 1/α times the parent patterns Pi of those N master reticles Ri while performing screen linkage (stitching exposure).

Figure 2:
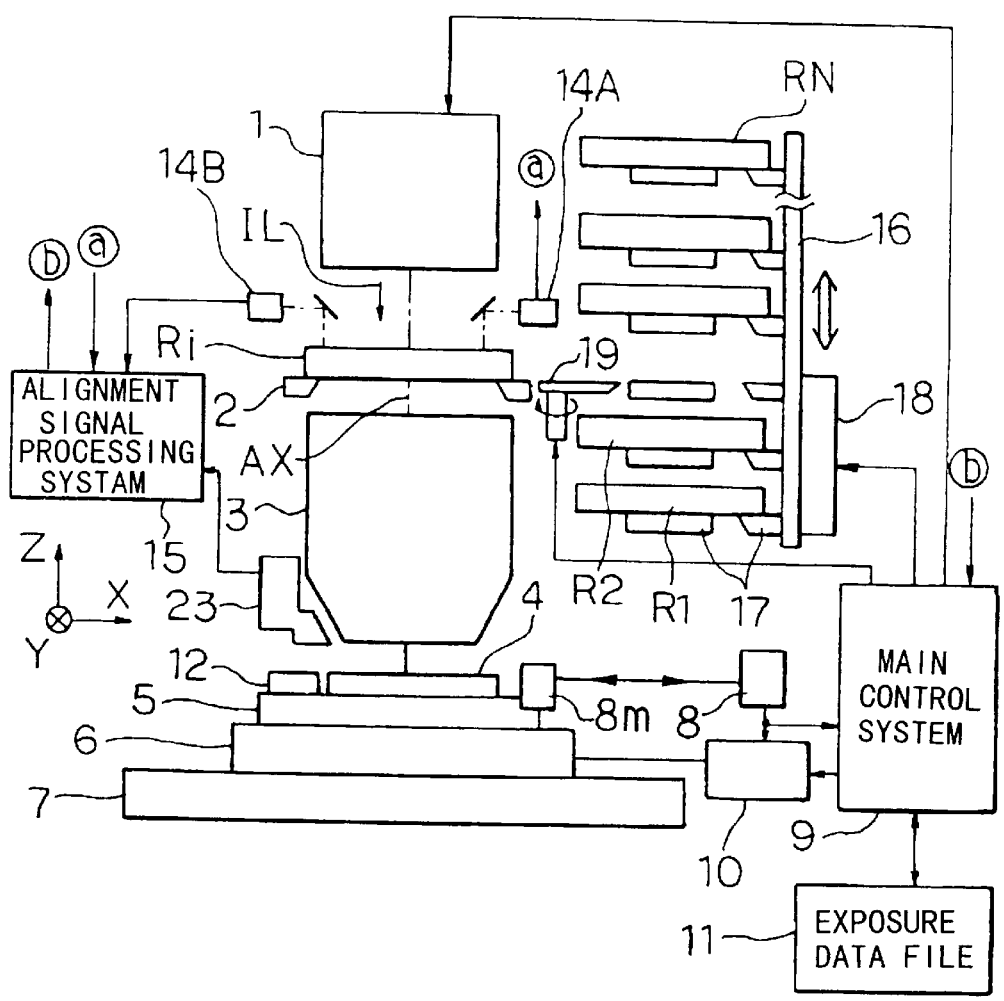
FIG. 2 is a partly cutaway, structural diagram showing an optical reduction projection exposure apparatus which is used in producing the working reticle as the embodiment in FIG. 1.

FIG. 2 shows an optical reduction projection exposure apparatus which is used in producing the working reticle 34. In FIG. 2, at the time of exposure, an illumination optical system 1, which comprises an exposure light source, a fly-eye lens for uniform illuminance distribution, an aperture stop of the illumination system, a reticle blind (variable field stop), a condenser lens system and so forth, irradiates exposure light IL on a reticle on a reticle stage 2. Placed on the reticle stage 2 in this example is the i-th (i=1 to N) master reticle Ri. The exposure light used is bright rays, such as i line (wavelength of 365 nm) from a mercury lamp or the light that is generated from a KrF excimer laser (wavelength of 248 nm), ArF excimer laser (wavelength of 193 nm) or $F_2$ laser (wavelength of 157 nm) or the like, or a harmonic generator like a YAG laser.

The image of the pattern of the master reticle Ri in the illumination area is projected onto the surface of a substrate 4 for the working reticle 34 at a reduction of 1/α (e.g., α is 5, or 4 or the like) via a projection optical system 3. The substrate 4 is a transmission type substrate of quartz glass or the like, a thin film of a mask material, such as chromium or molybdenum silicide, is formed on a pattern area 25 (see FIG. 4) on its surface, and the two alignment marks 24A and 24B comprised of two-dimensional marks for positional alignment are formed so as to sandwich this pattern area 25. A photoresist is coated on the surface of the substrate 4 in such a way as to cover the mask material. In the following description, the Z axis is parallel to the optical axis AX of the projection optical system 3, the X axis is parallel to the surface of the sheet of FIG. 2 in the plane perpendicular to the Z axis and the Y axis is perpendicular to the surface of the sheet of FIG. 2.

First, the reticle stage 2 positions the master reticle Ri thereon within the XY plane. Above the master reticle Ri are located alignment sensors 14A and 14B (only 14A is shown in FIG. 2) which detect the alignment marks 21A and 21B. The position of the reticle stage 2 is measured by a not-illustrated laser interferometer. The operation of the reticle stage 2 is controlled based on this measured value, the detection results of the alignment sensors 14A and 14B and control information from a main control system 9. The substrate 4 is held on a not-illustrated substrate holder by a vacuum, and this substrate holder is fixed on a sample table 5 which is secured onto an XY stage 6. The sample table 5 aligns the surface of the substrate 4 with the image surface of the projection optical system 3 by controlling the focus position (the position along the optical axis AX) of the substrate 4 and the inclination angle by the auto-focus system. The XY stage 6 positions the sample table 5 (substrate 4) in the X direction and the Y direction on a base 7 by, for example, a linear motor system.

Figure 3:
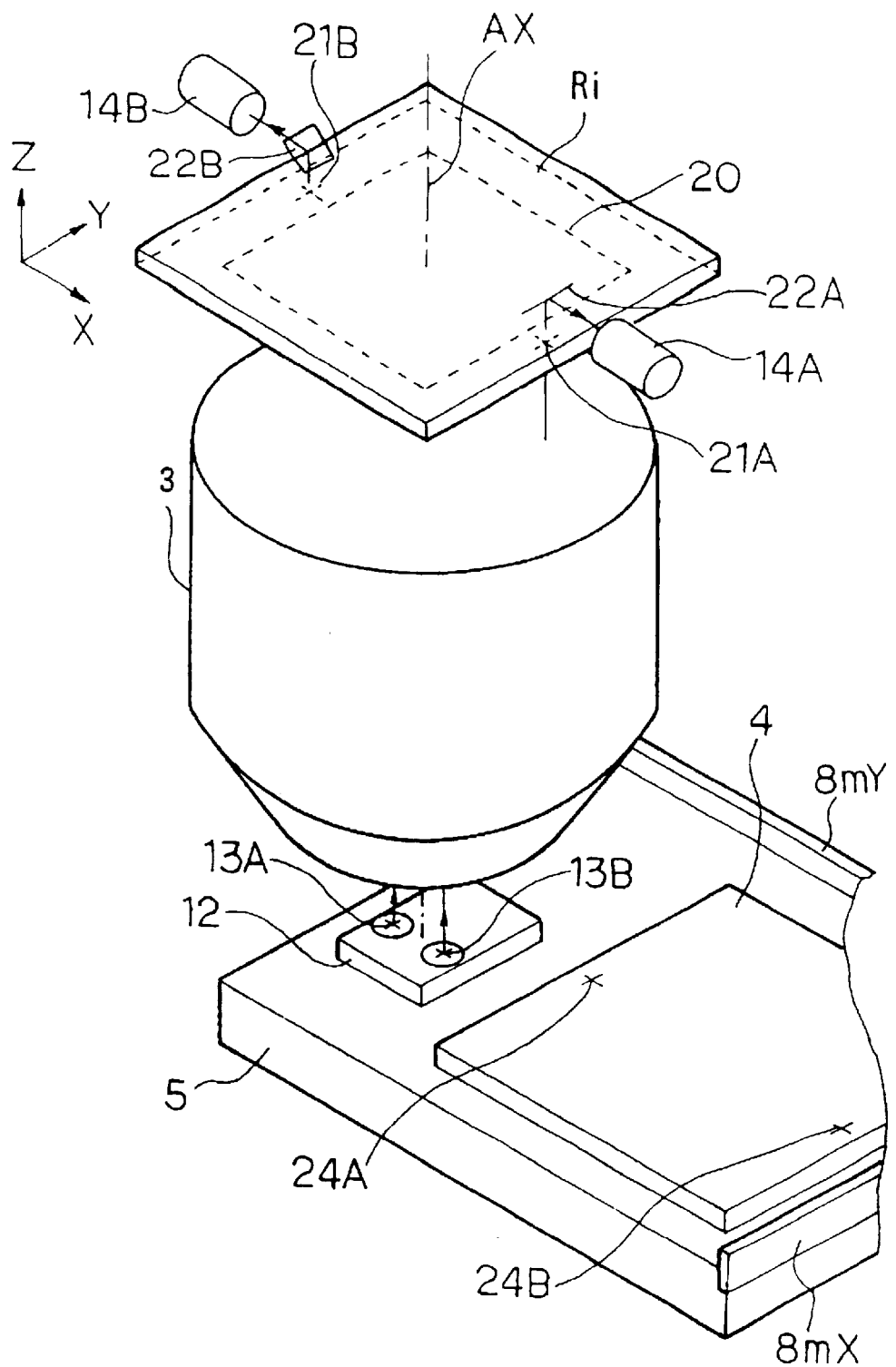
FIG. 3 is a partly cutaway, perspective view of essential portions of the projection exposure apparatus in FIG. 2 showing the case of executing alignment of a master reticle.

The X coordinate, Y coordinate and rotational angle of the sample table 5 are measured by a moving mirror 8m fixed on the top of the sample table 5 and a laser interferometer 8 located opposite thereto, and the measured values are supplied to a stage control system 10 and the main control system 9. The moving mirror 8m is a general term for a moving mirror 8mX on the X axis and a moving mirror 8mY on the Y axis, as shown in FIG. 3. The stage control system 10 controls the operation of a linear motor or the like of the XY stage 6 based on the measured values and the control information from the main control system 9.

In this example, a shelf-like reticle library 16 is located by the reticle stage 2, and the master reticles R1, R2, . . . , RN are placed on N support plates 17 arranged in the reticle library 16 in order in the Z direction. Those master reticles R1 to RN are reticles (parent masks) on which the parent patterns P1 to PN segmented from the parent pattern 36 in FIG. 1 are respectively formed. The reticle library 16 is so supported as to be movable in the Z direction by a slide unit 18, and a reticle loader 19 having an arm rotatable and movable in a predetermined range in the Z direction is located between the reticle stage 2 and the reticle library 16. The main control system 9 is constructed in such a way that after adjusting the position of the reticle library 16 in the Z direction via the slide unit 18, it controls the operation of the reticle loader 19 so that a desired master reticle R1 to RN can be transferred and received between the desired support plate 17 and the reticle stage 2. In FIG. 2, the i-th master reticle Ri in the reticle library 16 is placed on the reticle stage 2.

Connected to the main control system 9 is a memory unit 11, such as a magnetic disk drive, in which an exposure data file is stored. Recorded in the exposure data file are the mutual positional relation and alignment information of the master reticles R1 to RN and data or the like of the image forming characteristics of projection images (projection optical system) of the projection exposure apparatus which uses the working reticle to be produced in this example.

At the time of exposing the substrate 4 in this embodiment, when exposure of the reduced image of the first master reticle R1 into the first shot area on the substrate 4 is completed, the next shot area on the substrate 4 is moved to the exposure area of the projection optical system 3 by the step movement of the XY stage 6. In parallel to this movement, the master reticle R1 on the reticle stage 2 is returned to the reticle library 16 via the reticle loader 19 and the next master reticle R2 to be transferred is placed on the reticle stage 2 from the reticle library 16 via the reticle loader 19. Then, after alignment of the master reticle R2 is performed by the alignment sensors 14A and 14B, the reduced image of the master reticle R2 is projected and exposed in that shot area on the substrate 4 via the projection optical system 3. Thereafter, the reduced images of the master reticles R2 to RN are exposed in the remaining, respective shot areas on the substrate 4 one after another by the step and repeat system.

Although the projection exposure apparatus in FIG. 2 is a static exposure type, a reduction projection exposure apparatus of a scanning exposure type such as the step and scan system may be used instead. The scanning exposure type synchronously scans the master reticle and the substrate by a reduction magnification ratio with respect to the projection optical system 3 at the time of exposure. As will be discussed later, there is a case where even an error (skew error or the like) which is hard for a static exposure type to correct can be corrected by the use of a scanning exposure type exposure apparatus.

At the time the reduced images of the master reticles R1 to RN are exposed on the substrate 4 this way, it is necessary to perform screen linkage (stitching) between adjoining reduced images with a high precision. To do so, it is necessary to make the alignment of each master reticle Ri (i=1 to N) with the corresponding shot area (Si) on the substrate 4 with a high precision. For this alignment, the projection exposure apparatus of this example is provided with an alignment mechanism for reticles and the substrate.

FIG. 3 shows the alignment mechanism for reticles according to this embodiment. In FIG. 3, a transmission type reference mark member 12 is secured on the sample table 5 in the vicinity of the substrate 4 and a pair of reference marks 13A and 13B of, for example, a cross-shape are formed on the reference mark member 12 at a predetermined interval in the X direction. Provided at the bottom of the reference marks 13A and 13B are illumination systems which illuminate the reference marks 13A and 13B toward the projection optical system 3 with the illumination light that is branched from the exposure light IL. At the time of aligning the master reticle Ri, the reference marks 13A and 13B are positioned in such a way that the centers of the reference marks 13A and 13B on the reference mark member 12 nearly match with the optical axis AX of the projection optical system 3 as shown in FIG. 3 by driving the XY stage 6 in FIG. 2.

Two alignment marks 21A and 21B of a cross shape as one example are formed so as to sandwich the pattern area 20 of the pattern surface (bottom surface) of the master reticle Ri. The distance between the reference marks 13A and 13B is set approximately equal to the distance between reduced images of the alignment marks 21A and 21B formed by the projection optical system 3. With the centers of the reference marks 13A and 13B nearly matched with the optical axis AX as mentioned above, the reference mark member 12 is illuminated from the bottom side with the illumination light of the same wavelength as that of the exposure light IL of the projection optical system 3, so that enlarged images of the reference marks 13A and 13B by the projection optical system 3 are formed in the vicinity of the alignment marks 21A and 21B of the master reticle Ri, respectively.

Mirrors 22A and 22B for reflecting the illumination light from the projection optical system 3 in the ±X direction are arranged above those alignment marks 21A and 21B and the alignment sensors 14A and 14B of an image processing type are provided in a TTR (Through The Reticle) mode to receive the illumination light reflected by the mirrors 22A and 22B. The alignment sensors 14A and 14B each have an image forming system and a two-dimensional image pickup device, such as a CCD camera. The image pickup devices pick up the images of the alignment marks 21A and 21B and the images of the corresponding reference marks 13A and 13B and the image pickup signals are supplied to an alignment signal processing system 15 in FIG. 2.

The alignment signal processing system 15 performs image processing of the image pickup signals to acquire the amounts of positional deviations of the alignment marks 21A and 21B in the X direction and the Y direction with respect to the images of the reference marks 13A and 13B, and those two sets of the amounts of the positional deviations are supplied to the main control system 9. The main control system 37 positions the reticle stage 2 in such a way that the two sets of the amounts of the positional deviations become symmetrical to each other and fall within predetermined ranges, respectively. This causes the alignment marks 21A and 21B and thus the parent pattern Pi (see FIG. 1) in the pattern area 20 of the master reticle Ri to be positioned with respect to the reference marks 13A and 13B.

In other words, the center of the reduced image (exposure center) of the parent pattern Pi of the master reticle Ri by the projection optical system 3 is substantially positioned to the center between the reference marks 13A and 13B (nearly the optical axis AX) and the perpendicular sides of the contour of the parent pattern Pi (the contour of the pattern area 20) are set parallel to the X axis and the Y axis, respectively. Under this situation, the main control system 9 in FIG. 2 memorizes the X coordinate and Y coordinate ($XF_0$, $YF_0$) of the sample table 5 that are measured by the laser interferometer 8, thus completing the alignment of the master reticle Ri. Thereafter, an arbitrary point on the sample table 5 can be moved to the exposure center of the parent pattern Pi.

In FIG. 2, an alignment sensor 23 of an image processing type is provided in off-axis mode on the side of the projection optical system PL to detect the positions of marks on the substrate 4. The alignment sensor 23 illuminates a to-be-detected mark with illumination light of a wide band to which a photoresist is not photosensitive, picks up the image of the to-be-detected mark with a two-dimensional image pickup device, such as a CCD camera, and supplies an image pickup signal to the alignment signal processing system 15. The distance (base line amount) between the detection center of the alignment sensor 23 and the center of the projection image of the pattern of the master reticle Ri (exposure center) has been acquired in advance by using a predetermined reference mark on the reference mark member 12 and stored in the main control system 9.

As shown in FIG. 3, the two alignment marks 24A and 24B of, for example, a cross shape are formed on the end portions of the substrate 4 in the X direction. After the alignment of the master reticle Ri is completed, the XY stage 6 is driven to sequentially move the reference marks 13A and 13B and the alignment marks 24A and 24B on the substrate 4 in FIG. 3 to the detection area of the alignment sensor 23 in FIG. 2 and the amounts of positional deviations of the reference marks 13A and 13B and the alignment marks 24A and 24B with respect to the detection center of the alignment sensor 23 are measured. The position of the sample table 5 when each of the reference marks 13A and 13B and the alignment marks 24A and 24B is detected by the alignment sensor 23 is measured by the laser interferometer 8. Those measurement results are supplied to the main control system 9, which uses those measurement results to acquire the coordinates ($XP_0$, $YP_0$) of the sample table 5 when the center of the reference mark 13A, 13B coincides with the detection center of the alignment sensor 23 and the coordinates ($XP_1$, $YP_1$) of the sample table 5 when the center of the alignment mark 24A, 24B coincides with the detection center of the alignment sensor 23. This completes the alignment of the substrate 4.

Figure 4:
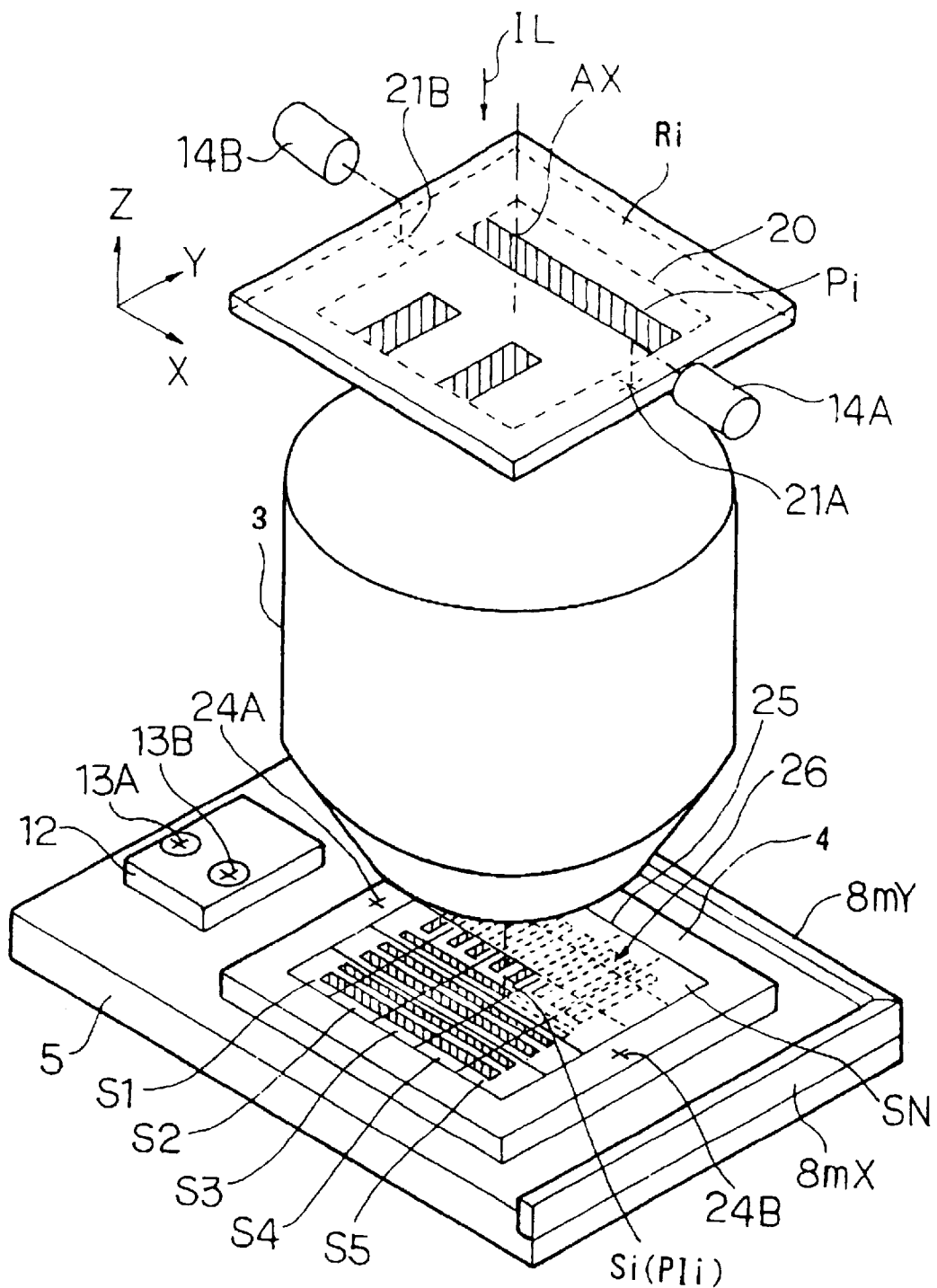
FIG. 4 is a perspective view of essential portions of the projection exposure apparatus in FIG. 2 showing the case of projecting the reduced image of a parent pattern of a master reticle on a substrate 4.

As a result, the X-directional and Y-direction distances between the center of the reference mark 13A, 13B and the center of the alignment mark 24A, 24B become ($XP_0$–$XP_1$, $YP_0$–$YP_1$). Therefore, by driving the XY stage 6 in FIG. 2 by the distances ($XP_0$–$XP_1$, $YP_0$–$YP_1$) with respect to the coordinates ($XF_0$, $YF_0$) of the sample table 5 at the time of aligning the master reticle Ri, the center between the alignment marks 24A and 24B on the substrate 4 (the center of the substrate 4) can be matched with the center between the projection images (exposure center) of the alignment marks 21A and 21B of the master reticle Ri with a high precision, as shown in FIG. 4. By moving the XY stage 6 in FIG. 2 to move the sample table 5 in the X direction and the Y direction from this state, the reduced image PIi of the parent pattern Pi of the master reticle can be exposed at the desired position with respect to the center on the substrate 4.

That is, FIG. 4 shows the reduction projection of the parent pattern Pi of the i-th master reticle Ri on the substrate 4 via the projection optical system 3. In FIG. 4, the rectangular pattern area 25 surrounded by sides parallel to the X axis and the Y axis with the center between the alignment marks 24A and 24B on the surface of the substrate 4 being the center is imaginarily set in the main control system 9. The size of the pattern area 25 is the size of the parent pattern 36 in FIG. 1 reduced to $1/\alpha$, the pattern area 25 is equally divided into $\alpha$ segments in each of the X direction and the Y direction, and shot areas S1, S2, S3, . . . , SN ($N=\alpha^2$) are imaginarily set. The position of the shot area Si (i=1 to N) is set to the projection position of the reduced image PIi of the i-th parent pattern Pi when the parent pattern 36 in FIG. 1 is projected in reduction via, for example, the projection optical system 3 in FIG. 4.

When the image forming characteristic of the projection image of the projection exposure apparatus that uses the working reticle 36 of this embodiment is ideal, the main control system 9 drives the XY stage 6 in FIG. 2 to match the center of the i-th shot area Si on the substrate 4 with the exposure center of the reduced image PIi of the parent pattern Pi of the demanded master reticle Ri by the above-described alignment. Thereafter, the main control system 9 starts emission of the exposure light source in the illumination optical system 1 in FIG. 2 to expose the reduced image of the parent pattern Pi in the shot area Si on the substrate 4. In FIG. 4, the reduced images of the parent patterns already exposed in the pattern area 25 on the substrate 4 are indicated by solid lines and unexposed reduced images are indicated by broken lines.

Figure 12:
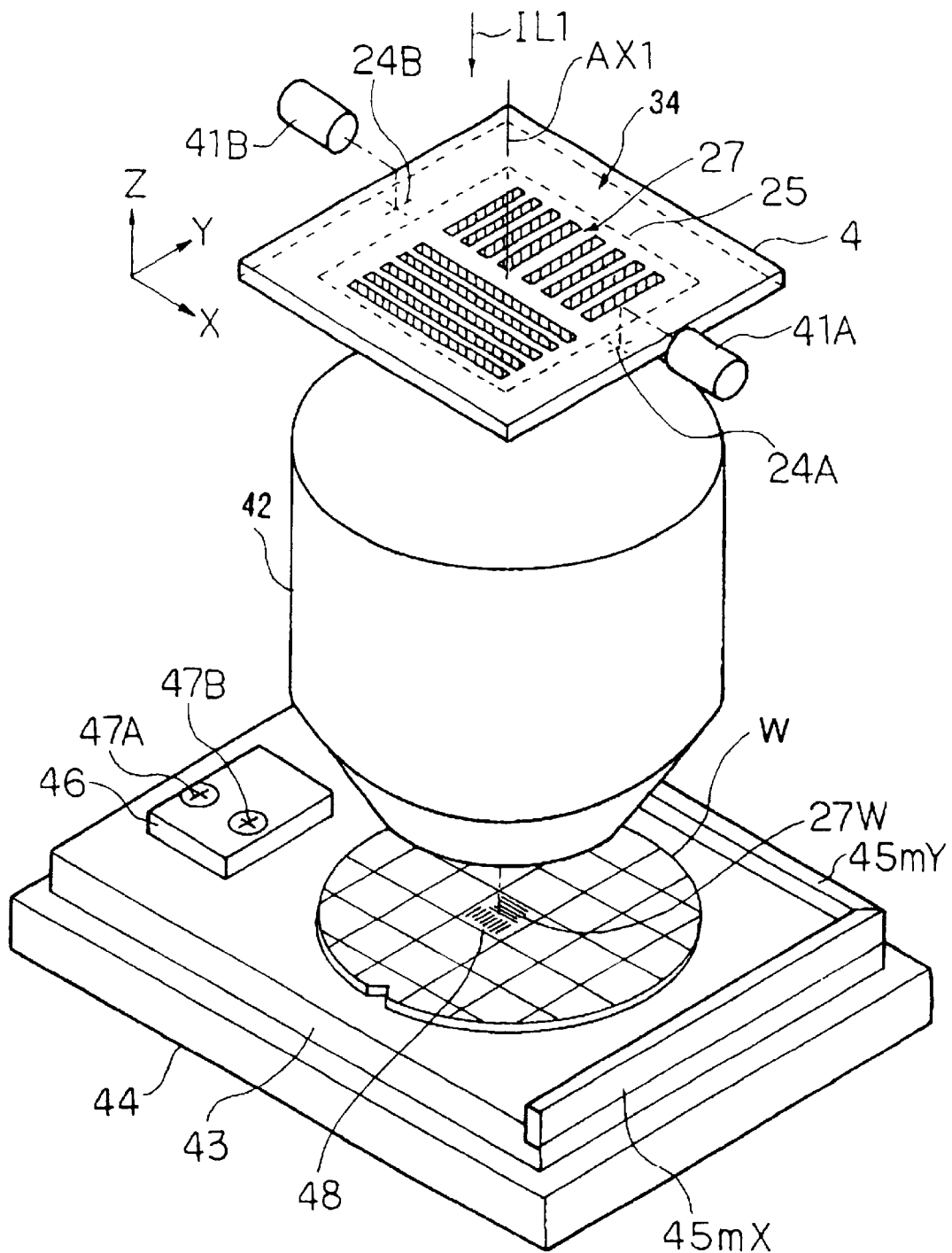
FIG. 12 is a perspective view showing the essential portions of a projection exposure apparatus which projects the pattern of a working reticle to be produced by the embodiment on a wafer.

As the reduced images of the parent patterns P1 to PN of the N master reticles R1 to RN in FIG. 2 are exposed in the respective shot areas S1 to SN on the substrate 4 one after another in the above manner, the reduced images of the individual parent patterns P1 to PN are exposed using stitching exposure technique while screen linkage with the reduced images of the adjoining parent patterns is being performed. Accordingly, a projection image 26 which is the parent pattern 36 in FIG. 1 reduced to $1/\alpha$ is exposed on the substrate 4. Then, a photoresist on the substrate 4 is developed, and etching and separation of the remaining resist pattern, or the like are carried out, so that the projection image 26 on the substrate 4 becomes the original pattern 27 as shown in FIG. 12, thus completing the working reticle 34.

At the time of exposing a single substrate 4, the substrate 4 is secured onto the sample table 5 regardless of exchange of the master reticle Ri, and its position is accurately measured by the laser interferometer 8. Because the positional relation between the reference marks 13A and 13B and the substrate 4 does not change during exposure of a single substrate 4, the master reticle Ri has only to be aligned with the reference marks 13A and 13B at the time of exchanging the master reticle Ri and the positions of the alignment marks 24A and 24B on the substrate 4 do not have to be detected for each master reticle. In this case too, the parent patterns Pi on the master reticle Ri are exposed while keeping their accurate positional relation through the alignment with the reference marks 13A and 13B and under the positional control of the XY stage 6 by the stage control system 10 which is monitored by the laser interferometer 8. Needless to say, the precision of linkage between the individual patterns becomes high.

The alignment marks 24A and 24B do not necessarily have to be formed on the substrate 4 in advance. At this time, at the time of performing reduction transfer by connecting the parent patterns on the master reticle Ri as mentioned above, predetermined marks (e.g., the alignment marks 21A and 21B) on each master reticle Ri may be reduced and transferred, the positions of the latent images of the marks may be detected at the time of transferring the reduced images of the parent patterns on an adjacent master reticle, and the transfer positions of the reduced images of the parent patterns on the adjacent master reticle may be corrected based on the detection results. The position of the short area on the substrate 4 where the reduced image of the next parent pattern is to be transferred may be determined using both the alignment marks 24A and 24B and the latent images of the aforementioned marks. The alignment marks 24A and 24B are formed in advance on the substrate 4 with a laser beam lithography system or an electron beam lithography system or the like prior to the transfer of the patterns of a plurality of master reticles on the substrate 4 using the master reticles.

When reduction transfer of m-th (an integer satisfying $N \geq m \geq 3$) and subsequent parent patterns of the master reticle Ri on the substrate is carried out, because the reduced images of (m−1) parent patterns have already been transferred on the substrate 4, the latent images of marks of each of or some of the transferred images of the (m−1) parent patterns may be detected to acquire their positional information and the plural pieces of positional information may be subjected to an averaging process or a statistical process to determine the position of the shot area (sample table 5) on the substrate 4 where the reduced image of the m-th parent pattern is to be transferred. At this time, the position of the shot area on the area on the substrate 4 where the reduced image of the m-th parent pattern should be transferred may be determined by carrying out the averaging process or statistical process after weights according to the distances between all or some of the shot areas where, for example, the reduced images of (m−1) parent patterns have been transferred and the short area where the reduced image of the m-th parent pattern is to be transferred are given to the positional information of the latent images of the marks which are detected in all or some of the shot areas. Or, prior to the aforementioned averaging process or statistical process, of the shot areas where the reduced images of (m−1) parent patterns have been transferred, only at least one shot area adjoining to the shot area where the reduced image of the m-th parent pattern has been transferred may be selected and the latent images of marks in the selected shot area may be detected to acquire their position information.

The number of marks to be formed on the master reticle Ri is not limited to 2 but the number may be 1 or 3 or greater. Further, the number of marks to be detected in each of the shot areas where the reduced images of (m−1) parent patterns have been transferred is not limited to 2 but the number may be 1 or 3 or greater. At this time, the number of marks to be detected may be made different shot area by shot area. Further, all the marks that are formed in a single shot area where the reduced images of parent patterns have been transferred may be detected, or only some of the marks may be detected. At this time, the layout (at least one of the quantity and the position) of marks to be detected may be made different shot area by shot area. A method of transferring a plurality of patterns on the substrate 4 by linking them together is disclosed in, for example, Japanese Unexamined Patent Application, First Publication No. 5-197158 and its corresponding U.S. Pat. No. 5,298,761, and the disclosures in this publication and the U.S. patent are incorporated herein by reference as a part of the present description within what is permitted by the domestic laws of the country specified or selected in this international application.

When, for example, dense patterns and isolated patterns are formed in the original pattern 27 in FIG. 1, only the dense patterns may be formed in one master reticle Ra in the master reticles R1 to RN and the isolated patterns may be formed in another single master reticle Rb. At this time, since the optimal exposure conditions, such as the illumination condition and image forming condition, differ between dense patterns and isolated patterns, the exposure conditions, such as the shape and size of the aperture stop in the illumination optical system 1, i.e., the intensity distribution of the exposure light on the Fourier transform plane with respect to the pattern surface of the master reticle Ri in the illumination optical system 1, the coherence factor ($\sigma$ value) and the numerical aperture of the projection optical system 3, may be optimized. At that time, when the parent pattern Pi is a dense pattern (cyclic pattern), a modified illumination method should be employed so that the shape of the secondary light source is defined as an annular shape or a plurality of local areas apart at equal distances from the optical axis of the illumination optical system. An exposure system which alters the shape and size of the secondary light source in accordance with the reticle pattern is disclosed in, for example, Japanese Unexamined Patent Application, First Publication No. 5-304076 and its corresponding U.S. Pat. No. 5,335,044, and the disclosures in this publication and the U.S. patent are incorporated herein by reference as a part of the present description within what is permitted by the domestic laws of the country specified or selected in this international application. To optimize the exposure conditions, an optical filter which shields the exposure light in a circular area about, for example, the optical axis (a so-called pupil filter) may be inserted or removed from the vicinity of the pupil plane of the projection optical system 3, or a so-called progressive focusing method (flex method) which vibrates the image plane of the projection optical system 3 and the surface of the substrate 4 within a predetermined range in relative to each other may be used together. An exposure system which has a mechanism of inserting or removing the pupil filter is disclosed in, for example, Japanese Unexamined Patent Application, First Publication No. 8-8157 and its corresponding U.S. Pat. No. 5,677,757, and an exposure system which employs the progressive focusing method is disclosed in, for example, Japanese Unexamined Patent Application, First Publication No. 5-13305 and its corresponding U.S. Pat. No. 5,483,311, and the disclosures in those publications and U.S. patents are incorporated herein by reference as a part of the present description within what is permitted by the domestic laws of the country specified or selected in this international application.

The aforementioned progressive focusing method may be employed with a parent mask being a phase-shifting mask and the $\sigma$ value of the illumination optical system set to about 0.1 to 0.4.

A photomask is not limited to a mask comprising only a light-shielding layer of chromium or the like, but may be a phase-shifting mask of a spatial frequency modulation type (Shibuya-Levenson type), edge enhancing type and halftone type. In the spatial frequency modulation type or edge enhancing type, particularly, the phase shifter is patterned to overlap the light-shielding pattern on the mask substrate, so that, for example, the parent mask for the phase shifter should be prepared separately.

A description will now be given of the case where the image forming characteristic of a projection image of the projection exposure apparatus that uses the working reticle 34 is not in the ideal state. If the projection exposure apparatus shown in FIG. 12 that uses the working reticle 34 is a static exposure type, a certain degree of a non-rotational symmetric aberration, or distortion or the like remains in the image forming characteristic of its projection optical system 42. It is assumed here that distortion which causes a grid-like ideal image 28 indicated by the broken line to become a bobbin type (or a barrel type or the like) projection image 29 indicated by the solid line is present in the image forming characteristic of the projection optical system 42 as shown in FIG. 5A.

Figure 5A:
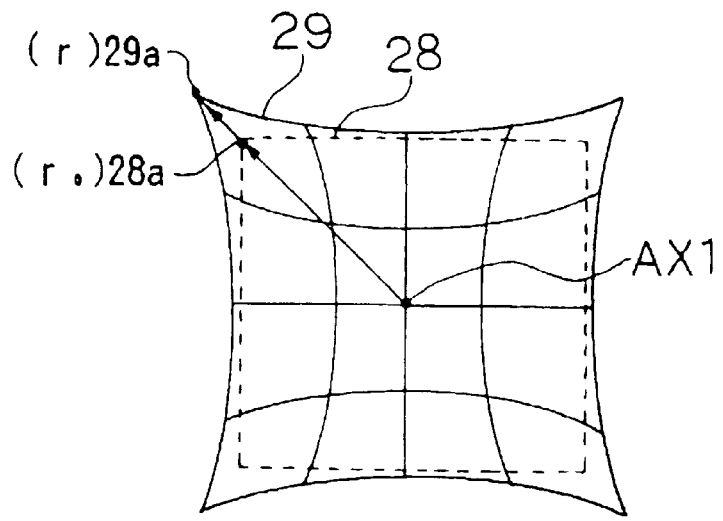
FIG. 5A is a diagram showing one example of an error in the image forming characteristic of a projection exposure apparatus which uses a master reticle to be produced by the embodiment.

In FIG. 5A, given that r is the distance from the optical axis AX1 of the projection optical system to a point 29a on the projection image 29 and $r_0$ is the distance from the optical axis AX1 to a point 28a on the corresponding ideal image 28, the distortion D(r) at the distance r is expressed by the following equation.

$$D(r)=(r-r_0)/r \qquad (1)$$

Therefore, the amount of the positional deviation of the projection image 29 to the ideal image 28 at the distance r becomes approximately $r \cdot D(r)$.

In this case, the exposure position is shifted laterally in the X direction and the Y direction from an original shot area Si in such a way as to cancel out the distortion, at the time the reduced image of the parent pattern Pi of the i-th master reticle is projected on the substrate 4 as shown in FIG. 4 in this example.

Figure 5B:
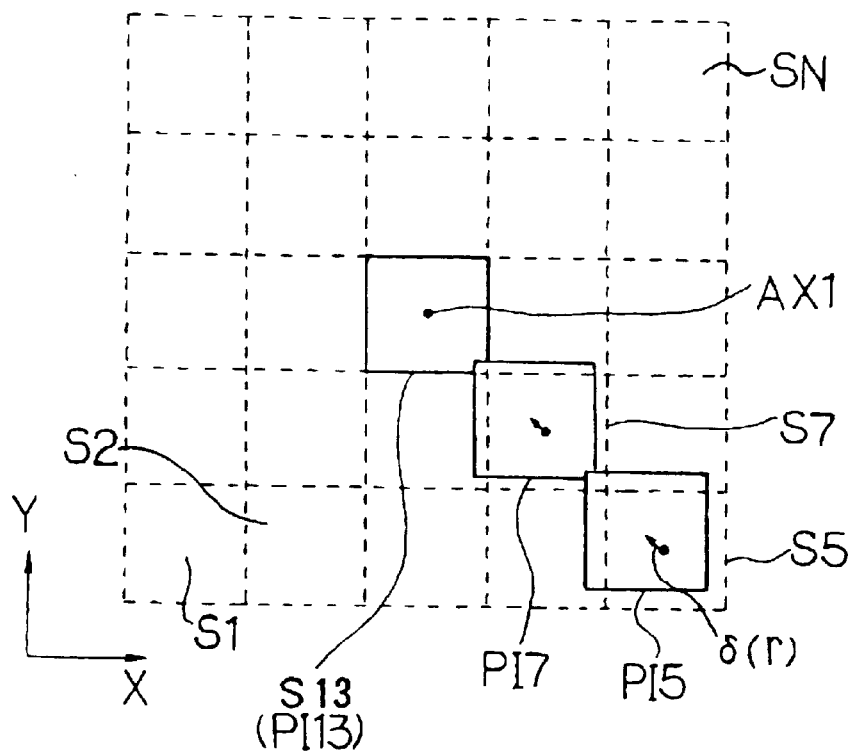
FIG. 5B is a diagram illustrating a method of correcting the image forming characteristic of the reduced image of a parent pattern on the master reticle in order to cancel out the error in the image forming characteristics.

FIG. 5B shows the arrangement of the shot areas S1, S2, . . . , SN on the substrate 4, and the reduced image PI5 of the parent pattern corresponding to the original shot area S5 is projected in this FIG. 5B. In this case, given that r is the distance from the center of the shot area S5 to the optical axis AX1 of an expected projection optical system to be used, the amount of positional deviation in the radial direction of the projection position when this shot area S5 is projected in reduction to $1/\beta$ by the projection optical system becomes $(r/\beta)D(r/\beta)$ from equation (1). Further, the amount of the positional deviation by the projection optical system in the case where the exposure position of the reduced image PI5 has previously been shifted by $\delta(r)$ with respect to the shot area S5 becomes $\delta(r)/\beta$. Therefore, the condition for canceling the distortion with this amount of positional deviation becomes as follows.

$$\delta(r)/\beta=-(r/\beta)D(r/\beta) \qquad (2)$$

From this equation (2), the amount of positional deviation $\delta(r)$ becomes as follows.

$$\delta(r)=-rD(r/\beta) \qquad (3)$$

In this equation, the minus sign when $D(r/\beta)$ takes a positive value means that the reduced image PI5 is shifted in the direction of the optical axis AX. Likewise, for the shot area S7, the exposure position of a corresponding reduced image PI7 should have been shifted in such a way as to satisfy the equation (3) and reduced images should have been shifted similarly for other shot areas. For the shot area S13 on the optical axis AX1, it is unnecessary to change the position of a reduced image PI13. Accordingly, the distortion in FIG. 5A is canceled out and the ideal image 28 is exposed.

As apparent from FIG. 5A, with regard to the partial area in the projection image 29 whose distance from the optical axis AXI is r, the magnification is changed by $\Delta\beta(r)$ and the slight non-rotational symmetric deformation generated. In this respect, it is desirable that the projection optical system 3 of the projection exposure apparatus in FIG. 4 should be provided with a correction mechanism which drives a predetermined lens element in, for example, the projection optical system 3 or the like so that the projection magnification and distortion can be controlled within predetermined ranges. At the time the reduced image PI5 is exposed in the shot area S5 in, for example, FIG. 5B, not only the exposure position should be shifted by $\delta(r)$ using the projection exposure apparatus in FIG. 4 but also the magnification of the projection optical system 3 should be so corrected as to cancel out the corresponding magnification error $\Delta\beta(r/\beta)$ and the distortion characteristic of the projection optical system 3 should be so corrected as to cancel out the corresponding local distortion as much as possible. This can allow the overall distortion in FIG. 5A to be canceled out with high precision.

Figure 6A:
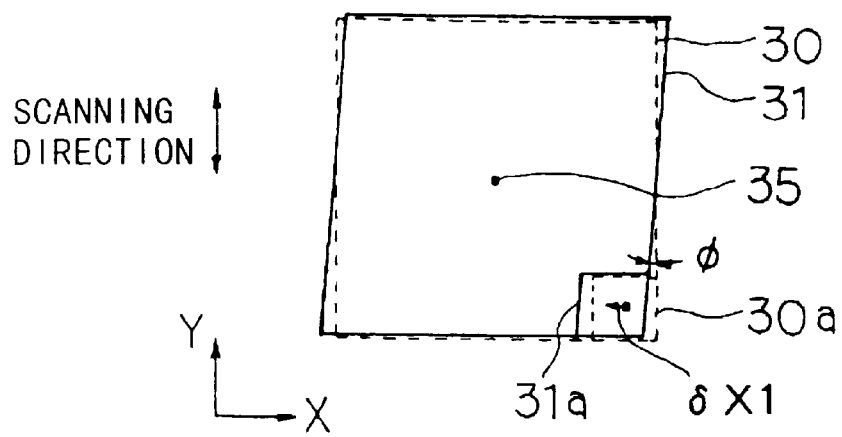
FIG. 6A is a diagram showing another example of an error in the image forming characteristic of a projection exposure apparatus which uses a master reticle to be produced by the embodiment.

A description will now be given of the case where the projection exposure apparatus in FIG. 12 is a scanning exposure type, such as the step and scan system, and a so-called skew error which causes a rectangular ideal image 30 indicated by the broken line to become a parallelepiped projection image 31 indicated by the solid line remains in the image forming characteristic of its projection image as shown in FIG. 6A.

In FIG. 6A, while the center of the projection image 31 is the center, 35, of the ideal image 30, the projection image 31 is deformed, with respect to the ideal image 30, by an angle $\phi$ clockwise with respect to the Y axis that is the axis along the scanning direction. This is an error specific to the scanning exposure system that occurs when the scanning direction of a reticle deviates from the scanning direction of a substrate to be exposed, and, for example, a partial image 31a at the peripheral portion of the projection image 31 is laterally shifted by $\delta X1$ in the −X direction with respect to an ideal partial image 30a and is deformed in a parallelepiped shape by an angle $\phi$.

In this case, according to this embodiment, a projection exposure apparatus of the step and scan type which has the Y direction as the scanning direction is used as the projection exposure apparatus which sequentially projects the reduced images of the parent patterns of the master reticles R1 to RN in FIG. 4. At the time of exposing a reduced image PI21 of the parent pattern of a master reticle R21 corresponding to the partial image 31a in FIG. 6A, for example, the image forming characteristic is so corrected as to cancel out the amount of the lateral deviation $\delta X1$ and an error in angle $\phi$.

Figure 6B:
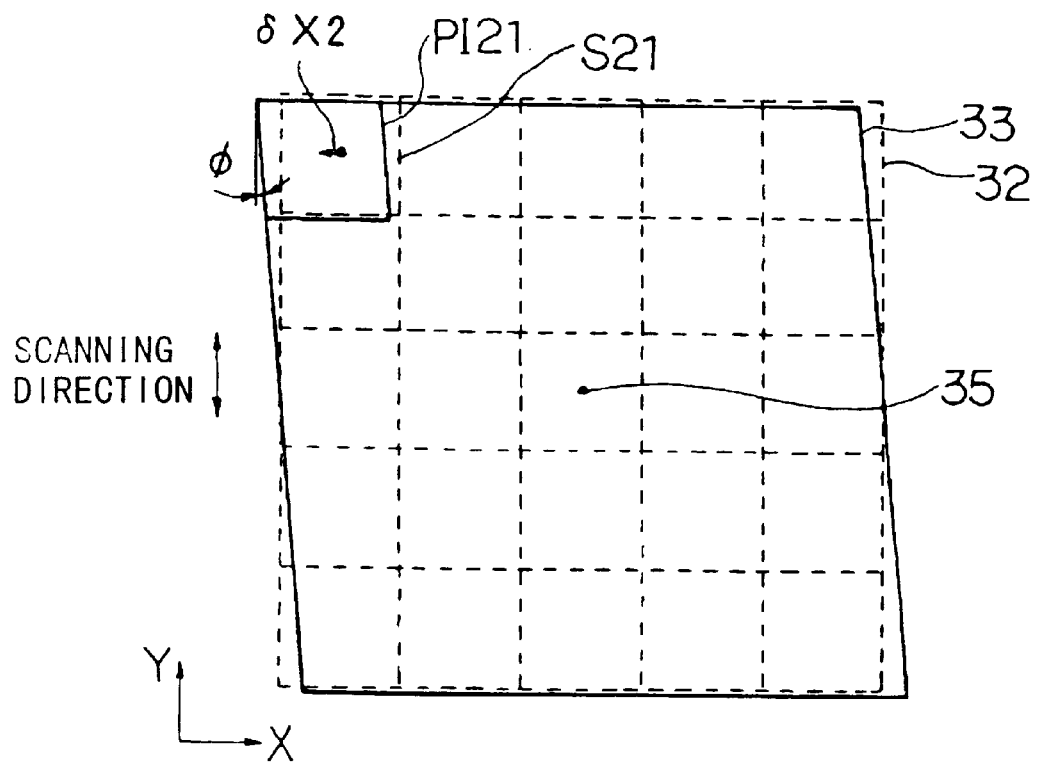
FIG. 6B is a diagram illustrating a method of correcting the image forming characteristic of the reduced image of a parent pattern on the master reticle in order to cancel out the error in the image forming characteristics.

The layout 32 indicated by the broken lines in FIG. 6B indicates the designed layout of the shot areas on the substrate 4, and it is assumed that the reduced image PI21 of the parent pattern is projected on a designed shot area S21 corresponding to the partial image 30a in FIG. 6A. In this case, as the amount of the lateral deviation when the shot area S21 is projected in reduction to $1/\beta$ by the projection optical system is $\delta X1$, the amount of the positional deviation by that projection optical system in the case that the exposure position of the reduced image PI21 has previously been shifted by $\delta X2$ with respect to the shot area S21 becomes $-\delta X2/\beta$ (the minus sign originates from the inverted projection). Therefore, the condition for canceling the amount of lateral deviation $\delta X1$ with this amount of the positional deviation becomes as follows.

$$-\delta X2/\beta = -\delta X1 \tag{4}$$

From this equation (4), the amount of positional deviation $\delta X2$ becomes $\beta \cdot \delta X1$.

Further, according to this embodiment, the reduced image PI21 is deformed by an angle $\phi$ counterclockwise with respect to the Y axis by shifting the scanning direction of the master reticle from that of the substrate with the scanning direction being the Y direction. Likewise, for the other shot areas, the exposure positions of the corresponding reduced images are laterally shifted and are deformed by an angle $\phi$ counterclockwise with respect to the Y axis. This substantially cancels out the skew error in FIG. 6A, causing the ideal image 30 to be exposed. The scanning exposure apparatus which corrects the aforementioned magnification error, image deformation and so forth is disclosed in, for example, Japanese Unexamined Patent Application, First Publication No. 6-310399, Japanese Unexamined Patent Application, First Publication No. 7-57991, and their corresponding U.S. patent application Ser. No. 08/233,319 (filed on Apr. 26, 1994), and the disclosures in those publications and the U.S. patent application are incorporated herein by reference as a part of the present description within what is permitted by the domestic laws of the country specified or selected in this international application.

Second Embodiment

A second embodiment of this invention will now be described with reference to the accompanying drawings.

Figure 7:
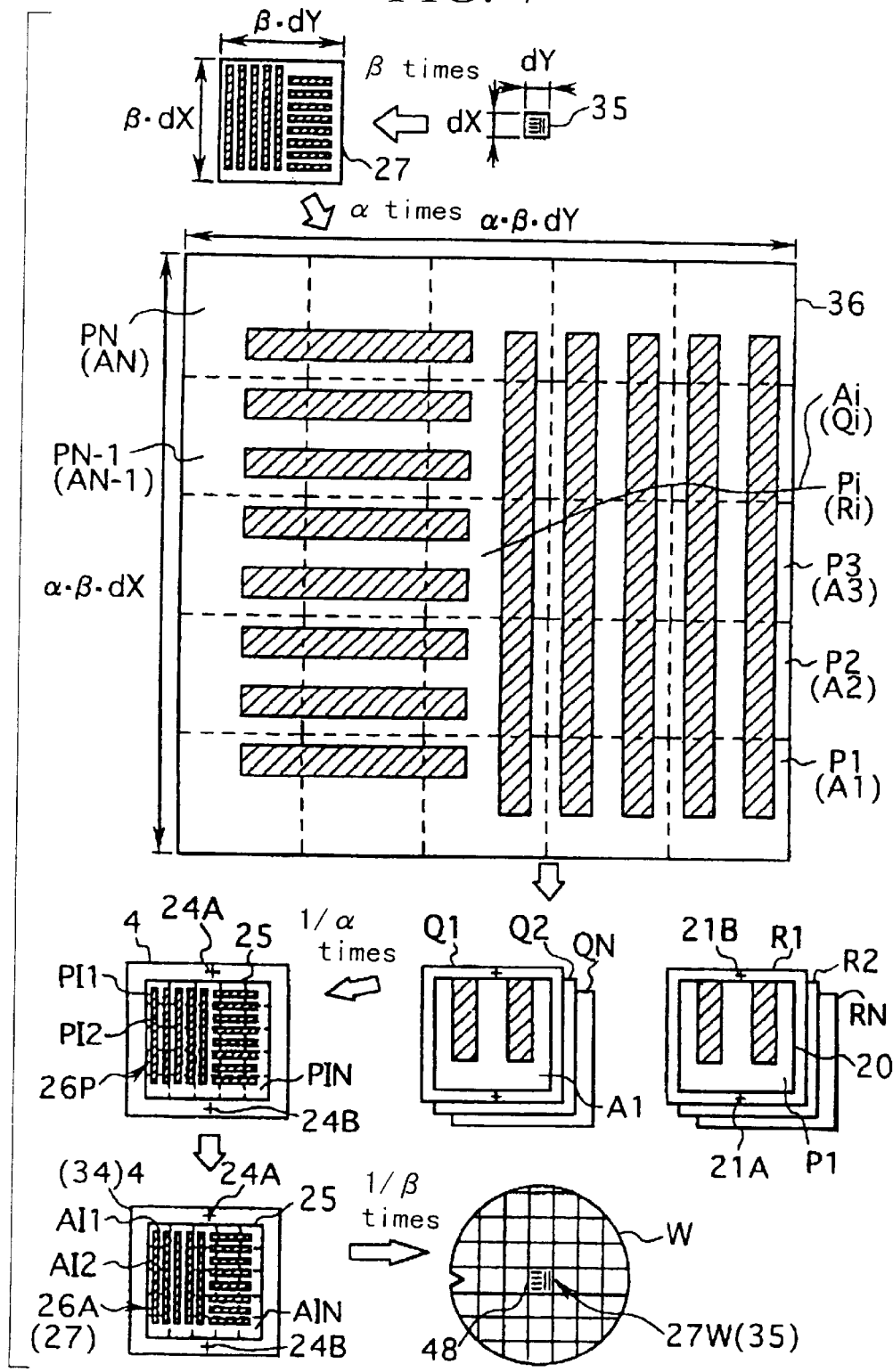
FIG. 7 is a diagram for explaining production steps for a working reticle (photomask) as another example of the embodiment of this invention.

FIG. 7 is a diagram illustrating production steps for a photomask according to the second embodiment of this invention. In FIG. 7, as in FIG. 1, a photomask to be produced is the working reticle 34 that is used at the time of actually manufacturing a semiconductor device. This second embodiment differs from the first embodiment in that M sets (M being an integer greater than 2) of master reticles as parent masks are prepared and those plural sets of master reticles Ri, Qi . . . are used to produce the working reticle 34.

In FIG. 7, as in FIG. 1, first, the circuit pattern 35 is magnified by $\beta$ to form the original pattern 27 that has a rectangular area whose perpendicular sides have widths of $\beta \cdot dX$ and $\beta \cdot dY$, on image data and then the original pattern 27 is magnified by $\alpha$ to form the parent pattern 36 that has a rectangular area whose perpendicular sides have widths of $\alpha \cdot \beta \cdot dX$ and $\alpha \cdot \beta \cdot dY$. Then, the parent pattern 36 is divided to form $\alpha \times \alpha$ parent patterns P1, P2, P3, . . . , PN (N=$\alpha^2$), and those parent patterns Pi (i=1 to N) are transferred in equal magnification on the master reticles Ri as the first set of N parent masks. The master reticle Ri is the same as that shown in FIG. 1.

Then, by using the write data of the parent patterns p1, P2, . . . , PN segmented from the parent pattern 36 again, the parent patterns Pi are transferred in equal magnification on the master reticles Qi as the second set of N parent masks. The parent patterns P1 to PN on the second set of master reticles Q1 to QN will be called below "parent patterns A1-AN" for the purpose of distinction.

According to this embodiment, as apparent from the above, the amount of each write data for each of the parent patterns Pi and Ai is reduced by about $1/\alpha^2$ as compared with that for the original pattern 27 and the minimum line width is α times the minimum line width of the original pattern 27, so that each parent pattern Pi, Ai can be written in a short period of time and with a high precision. Further, after master reticles R1 to RN and Q1 to QN are produced, the working reticles 34 can be produced by repeatedly using them, so that the time for producing the master reticles R1 to RN and Q1 to QN is not a heavy burden.

That is, the working reticle 34 is produced by transferring the reduced images PIi (i=1 to N), which are 1/α times the parent patterns Pi of the first set of N master reticles Ri, on the substrate 4 while performing screen linkage (stitching exposure), and then transferring the reduced images AIi (i=1 to N), which are 1/α times the parent patterns Ai of the second set of N master reticles Qi, on the substrate 4 in an overlapping manner while performing screen linkage (stitching exposure).

In the second embodiment too, the reduction projection exposure apparatus shown in FIG. 2 is used at the time of producing the working reticle 34 and the i-th (i=1 to N) master reticle Ri in the first set is placed on the reticle stage 2. Further, the first set of master reticles R1 to RN and the second set of master reticles Q1 to QN are placed on 2 N support plates 17 sequentially laid out in the Z direction in the reticle library 16 and the reticle loader 19 whose operation is controlled by the main control system 9 performs an exchange of a desired master reticle R1 to RN, Q1 to QN between the desired support plate 17 in the reticle library 16 and the reticle stage 2. In this case, it is needless to say that the mutual positional relation among the master reticles Q1 to QN and alignment information thereof are recorded in the memory unit 11 of the main control system 9.

At the time of exposing the substrate 4 in this embodiment, the reduced images of the first set of master reticles R1 to RN are exposed in the respective shot areas on the substrate 4 by the step and repeat system, then the reduced images of the second set of master reticles Q1 to QN are exposed on the substrate 4 in an overlapping manner. Of course, a reduction projection exposure apparatus of a scanning exposure type such as the step and scan system may be used instead of the static exposure type. The alignment mechanism shown in FIGS. 2 and 3 is used for high-precision screen linkage (stitching exposure) not only among the reduced images of the master reticles R1 to RN but also among the reduced images of the master reticles Q1 to QN. In this alignment, two cross-shaped alignment marks formed on the master reticle Qi are used as in the case of the master reticle Ri.

Figure 8A:
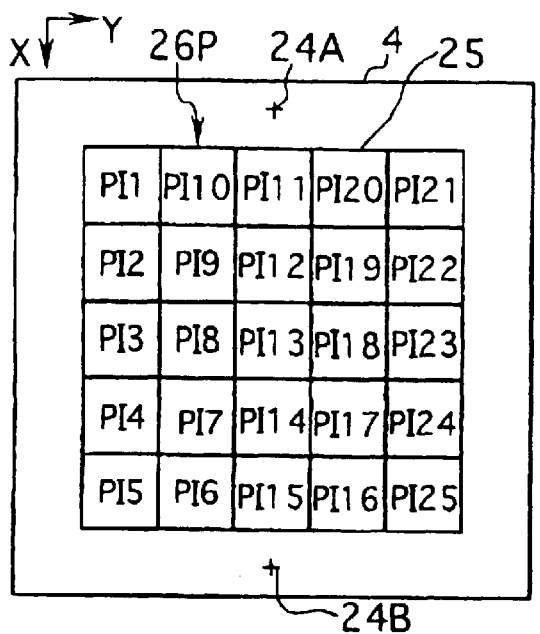
FIG. 8A is a plan view showing the reduced images of a first set of parent patterns to be exposed on a substrate 4 according to one example of the embodiment and FIG. 8B is a plan view showing the reduced images of a second set of parent patterns to be placed thereon.

By exposing the reduced images of the parent patterns P1 to PN of the first set of N master reticles R1 to RN on the corresponding shot areas S1 to SN on the substrate 4 in order this way, the reduced images PI1 to PIN of the individual parent patterns P1 to PN (N=25 in FIG. 8A) are exposed using stitching exposure technique while carrying out screen linkage with the reduced images of their adjoining parent patterns as shown in FIG. 8A. In FIG. 8A, the image that is obtained by connecting the reduced images PI1 to PIN together is a projection image 26P which is the parent pattern 36 in FIG. 7 reduced to 1/α.

Figure 8B:
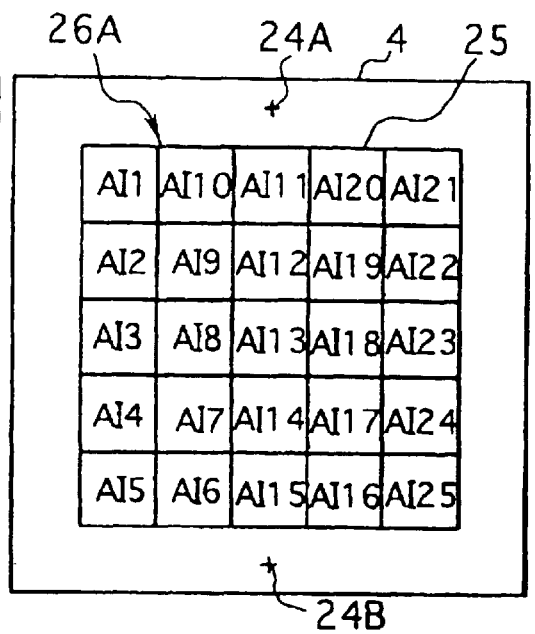

Thereafter, by performing alignment similarly, the reduced images AI1 to AIN of the parent patterns A1 to AN of the second set of N master reticles Q1 to QN in FIG. 7 are exposed, overlapped on the reduced images PI1 to PIN in FIG. 8A, as shown in FIG. 8B. In FIG. 8B, the image that is obtained by connecting the reduced images AI1 to AIN together is likewise a projection image 26A which is the parent pattern 36 in FIG. 7 reduced to 1/α. Then, the photoresist on the substrate 4 is developed, and etching and separation or the like of the remaining resist pattern are carried out, so that the projection images 26P and 26A on the substrate 4 become the original pattern 27 as shown in FIG. 12, thus completing the working reticle 34.

It is essential to provide the alignment marks 24A and 24B on the substrate 4 in advance in this embodiment too. In this case, at the time of performing reduction transfer of the parent patterns of the master reticles Ri, Qi, the predetermined marks (e.g., the alignment marks 21A and 21B) on each master reticle Ri, Qi may be reduced and transferred, the positions of the latent images of the marks may be detected at the time of transferring the reduced images of the parent patterns of an adjoining master reticle, and the transfer positions of the reduced images of the parent patterns of the adjoining master reticle may be corrected from the detection results. The position of the shot area on the substrate 4 where the reduced image of the next parent pattern is to be transferred may be determined using both the alignment marks 24A and 24B and the latent images of the aforementioned marks. Exactly as in the above-described first embodiment, positional information that is acquired by detecting the latent images of marks in each of at least two shot areas where the reduced images of the parent patterns have been transferred may be subjected to an averaging process or a statistic process to determine the position of the shot area on the substrate 4 where the reduced image of the next parent pattern should be transferred.

In this example, one shot area on the substrate 4 is double-exposed by using two sets of master reticles Qi and Ai. Therefore, the amount of exposure given to the substrate 4 by the first exposure using the master reticle Qi is made equal to the amount of exposure given to the substrate 4 by the second exposure using the master reticle Ai. That is, it is desirable to set the amount to a half of the proper exposure amount that is determined in accordance with the sensitivity characteristic of the photoresist. It is to be noted however that the total of the amounts of exposure given to the substrate 4 by the first and second exposures has only to be the aforementioned proper exposure amount, and the amount of exposure given to the substrate 4 by the first exposure may be made different from the amount of exposure given by the second exposure. When the amount of exposure given to the substrate 4 by the first exposure has not reached a target value (half of the proper exposure amount), for example, an amount of exposure that exceeds the target value (half of the proper exposure amount) should be imparted to the substrate 4 by the second exposure.

When, for example, dense patterns and isolated patterns are formed on the original pattern 27 in FIG. 7, the exposure conditions, i.e., the shape and size of the aperture stop in the illumination optical system 1, the coherence factor (σ value) and the numerical aperture of the projection optical system 3 or the like may be optimized in accordance with the parent pattern Ai not only for the master reticles R1 to RN but also for a single master reticle Qi in the master reticles Q1 to QN. To optimize the exposure conditions, a predetermined optical filter (a so-called pupil filter) may be inserted or removed from the vicinity of the pupil plane of the projection optical system 3, or a so-called progressive focusing method (flex method) which vibrates the image plane of the projection optical system 3 and the surface of the substrate 4 within a predetermined range in relative to each other may be used together.

Even with regard to the master reticles Q1 to QN, when a parent mask pattern includes isolated patterns such as contact holes, it would be better to employ the so-called progressive focusing method which moves the mask substrate along the optical axis of the exposure optical system while the mask substrate is being exposed with that pattern. Or, this progressive focusing method may be used together with an optical filter which is arranged on the pupil plane of the projection optical system and shields the illumination light that passes a circular area about the optical axis. Or, a parent mask may be a phase-shifting mask, the σ value of the illumination optical system may be set to about 0.1 to 0.4 and the aforementioned progressive focusing method may be used together.

With regard to the master reticles Q1 to QN, a photomask is not limited to a mask comprising only a light-shielding layer of chromium or the like, but may be phase-shifting masks of a spatial frequency modulation type (Shibuya-Levenson type), an edge enhancing type and a half-tone type. In the spatial frequency modulation type and the edge enhancing type, particularly, the phase shifter is patterned to overlap the light-shielding pattern on the mask substrate, so that, for example, the parent mask for the position shifter should be prepared separately.

As described above, the original pattern 2 of the working reticle 34 in this embodiment is formed by performing overlapping exposure of the reduced images of the parent patterns of two sets of master reticles R1 to RN and Q1 to QN. In this case, pattern position errors, variations in the line width, etc. which are produced at the time of writing the parent patterns of those master reticles differ between those two sets of master reticles. Therefore, double exposure of the reduced images of the parent patterns of those two sets of master reticles averages and reduces pattern position errors, variations in line width and so forth of the lithography system for master reticles. It is therefore possible to form the original pattern 27 of the working reticle 34 with a high accuracy.

When the image forming characteristic of the projection image of the projection exposure apparatus that uses the working reticle 34 is not in the ideal state, the exposure position is laterally shifted in the X direction and the Y direction from the original shot area Si in such a way as to cancel out the distortion or the like at the time of projecting the reduced image of the parent pattern Ai not only for the master reticle Pi but also for the master reticle Qi. Further, the projection magnification, the distortion characteristics and so forth should be corrected. Accordingly, when the working reticle 4 is used, an image close to an ideal image is exposed, thus improving the overlap precision or the like.

A so-called skew error which is produced by a projection exposure apparatus of a step and scan type may be addressed by deforming the pattern image of each master reticle in such a manner as to cancel out the skew error at the time of exposing the pattern image of each master reticle for each of the master reticles Pi and Qi.

In this embodiment, of two sets of master reticles R1 to RN and Q1 to QN, those master reticles on which cyclic dense patterns or the like are formed may be phase-shifting reticles.

Figure 9A:
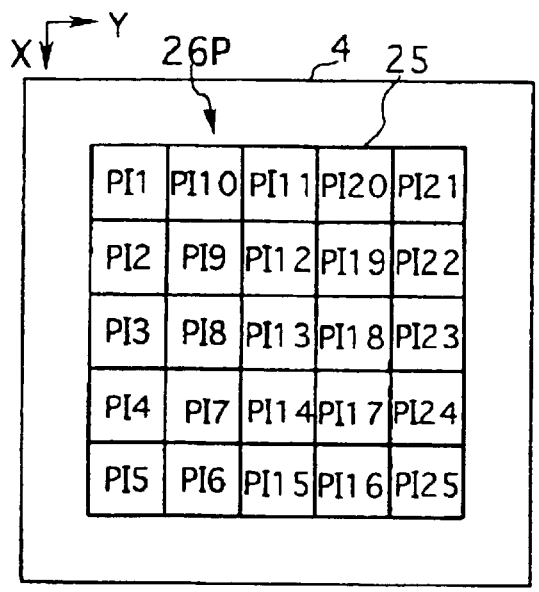
FIG. 9A is a plan view depicting the reduced images of a first set of parent patterns to be exposed on the substrate 4 according to another example of the embodiment.

Although the same parent patterns are formed on the two sets of master reticles R1 to RN and Q1 to QN and the images of the parent patterns of those two sets are exposed in an overlapping manner in the same shot area on the substrate 4 in this embodiment, the parent pattern 36 in FIG. 7 may be divided into two sets of parent patterns with different layouts (segmentation boundaries), and the reduced images of those two sets of parent patterns may be exposed on the substrate 4 in an overlapping manner. In this case, if the first set of parent patterns in those two sets are N parent patterns PI1 to PIN in FIG. 7, the reduced images PI1 to PIN of those parent patterns are exposed as the projection image 26P while being connected together in the pattern area 25 on the substrate 4, as shown in FIG. 9A. It is to be noted however that FIG. 9A shows the case where N=25.

Figure 9B:
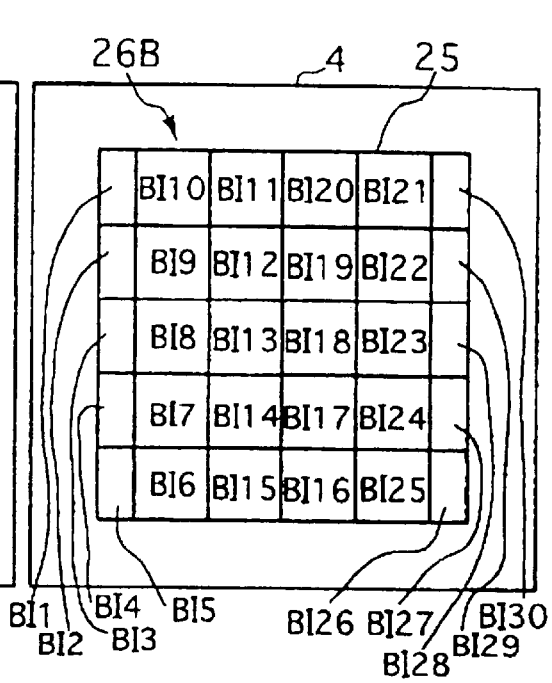
FIG. 9B is a plan view showing the reduced images of a second set of parent patterns to be placed thereon and FIG. 9C is an enlarged view of a part of a double-exposed image.
Figure 9C:
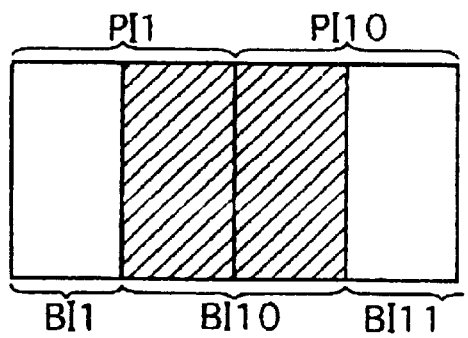

If the second set of plural parent patterns are patterns obtained by segmenting the parent pattern 36 in FIG. 7 at the Y-directional center positions of the parent patterns P1 to PN, reduced images BI1 to BI30 of the second set of parent patterns are exposed as a projection image 26B, overlapping the reduced images PI1 to PI25 in FIG. 9A in the Y direction as shown in FIG. 9B. At this time, as shown in FIG. 9C, the reduced image BI1 whose pattern area is a half the area of the reduced image PI1 and which has the same pattern as the left half of the reduced image PI1 and the left half of the reduced image BI10 which stretches over the reduced images PI1 and PI10 and thus has a half of each of the patterns of the reduced images PI1 and PI10 are exposed on the reduced image PI1 in FIG. 9A. At this time, the right half of the reduced image BI10 has the same pattern as the left half of the reduced image PI10 and those patterns are also exposed in an overlapping manner.

Execution of such exposure not only averages the write error between master reticles to be subjected to multi-exposure but also averages the distortion of the projection optical system 3 and variations in the transfer line width in the exposure area. It is therefore possible to transfer reduced images of the parent patterns onto the substrate 4 with a higher precision.

That is, as shown in FIG. 10A in an exaggerated way, even if the distortion as indicated by arrows DRL occurs in the exposure area of the projection optical system 3 in FIG. 2, when an image which has been transferred by using the right half FR thereof and an image which has been transferred by using the left half FL are combined (multi-exposed) as in an image SA in FIG. 10B, the total distortion is reduced as indicated by arrows DT due to the averaging effect. Further, because the second set of reduced images BI6 to BI25 stretch over the Y-directional boundary of the first set of reduced images PI1 to PI25, the linkage error in the Y direction is reduced by the averaging effect.

Although the second set of parent patterns are separated at the Y-directional center portions of the first set of parent patterns in the above-described example, the second set of parent patterns may be separated at the X-directional center of the first set of parent patterns. Further, the second set of parent patterns may be separated in the middle of the first set of parent patterns in the X direction and the Y direction. In this case, if the first set of parent patterns are the parent pattern 36 segmented into four lengthwise and breadthwise in FIG. 7, the reduced images PI1 to PI16 of the first set of 16 (=4×4) parent patterns are exposed as the projection image 26P while being connected to the pattern area 25 on the substrate 4 as shown in FIG. 11A. Thereafter, reduced images CI1 to CI25 of the second set of 25 parent patterns are exposed as a projection image 26C while being connected to the pattern area 25 on the substrate 4 as shown in FIG. 11B. By shifting the segmentation areas of the second set of parent patterns in the X direction and the Y direction this way, the linkage errors in the X direction and the Y direction of a final projection image is reduced by the averaging effect.

In any example, the number of multiple exposures is not limited to two, but three or more multiple exposures may be carried out using three or more sets of master reticles.

A description will now be given of one example of the operation in the case where exposure is performed by using the working reticle 34 in FIG. 1 or FIG. 7 that is produced in the above-described manner.

FIG. 12 shows the essential portions of a reduction projection exposure apparatus to which the working reticle 34 is mounted. In FIG. 12, a wafer W is placed at the bottom of the working reticle 34, held on the not-illustrated reticle stage via the projection optical system 42 having a reduction magnification $1/\beta$ ($\beta$ being 5 or 4 or the like). A photoresist is applied on the surface of the wafer W and its surface is so held as to be level with the image plane of the projection optical system 42. The wafer W is held on a sample table 43 via the not-illustrated wafer holder and the sample table 43 is secured onto an XY stage 44. The wafer W is positioned by driving the XY stage 44 based on the coordinates that are measured by moving mirrors 45mX and 45mY above the sample table 43 and a corresponding laser interferometer.

A reference mark member 46 on which reference marks 47 and 47B are formed is fixed on the sample table 3, and alignment sensors 41A and 41B for alignment of reticles are laid above the alignment marks 24A and 24B that are so formed as to sandwich the pattern area 25 of the working reticle 34 in the X direction. In this case too, the working reticle 34 is aligned with the sample table 43 by using the reference marks 47 and 47B, the alignment marks 24A and 24B and the alignment sensors 41A and 41B. In performing overlapping exposure thereafter, alignment of individual shot areas 48 on the wafer W is carried out using the not-illustrated alignment sensor for the wafer (e.g., the alignment sensor in FIG. 2). After the shot areas 48 on the wafer W to be exposed are sequentially positioned to the exposure position, the pattern area 25 of the working reticle 34 is irradiated with the exposure light IL1, such as the excimer laser beam, by the not-illustrated illumination optical system, thereby exposing an image 27W, which is the original pattern 27 in the pattern area 25 reduced to $1/\beta$, in the shot area 48. After the reduced image of the original pattern is exposed in each shot area on the wafer W in this manner, the wafer W is developed and a process, such as etching, is executed, so that the circuit pattern of a certain layer in a semiconductor device is formed in each shot area on the wafer W. The reduction projection exposure apparatus shown in FIG. 12 employs a so-called enhanced global alignment (EGA) system which detects marks in at least three shot areas (alignment shots), which are selected from, for example, a plurality of shot areas on the wafer W, by means of the respective alignment sensors and determines the exposure positional information of each shot area on the wafer W by performing a statistic process on the positional information of those marks. The EGA system is disclosed in, for example, Japanese Unexamined Patent Application, First Publication No. 61-44429 and its corresponding U.S. Pat. No. 4,780,617, and the disclosures in this publication and the U.S. patent are incorporated herein by reference as a part of the present description within what is permitted by the domestic laws of the country specified or selected in this international application.

A reduction projection exposure apparatus of a scanning exposure type, such as the step and scan system, may be used as the projection exposure apparatus for exposing the working reticle 34.

Third Embodiment

A third embodiment of this invention will now be described with reference to the accompanying drawings.

FIG. 13 is an explanatory diagram of a method of producing a photomask according to the third embodiment of this invention. As shown in FIG. 1C and FIG. 1D, photomasks to be produced in this example are working reticles WR, WR1 that are used at the time of actually manufacturing a semiconductor device. On those working reticles WR and WR1, patterns Pr equivalent to two alignment marks are so formed as to sandwich the original pattern, and a pattern Pw which becomes a wafer mark after being transferred onto the wafer is formed in the original pattern.

Further, the working reticles WR, WR1 of this example are used in reduction projection of $1/\beta$ via the projection optical system of an optical projection exposure apparatus as per the first and second embodiments.

Figure 13A:
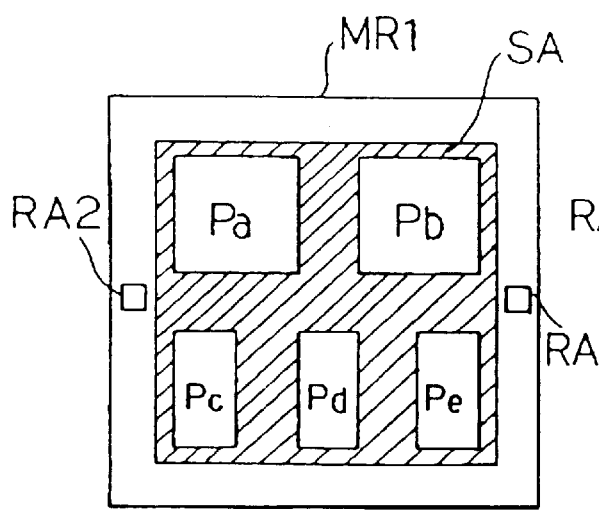
FIGS. 13A to 13D show another embodiment of this invention.
Figure 13B:
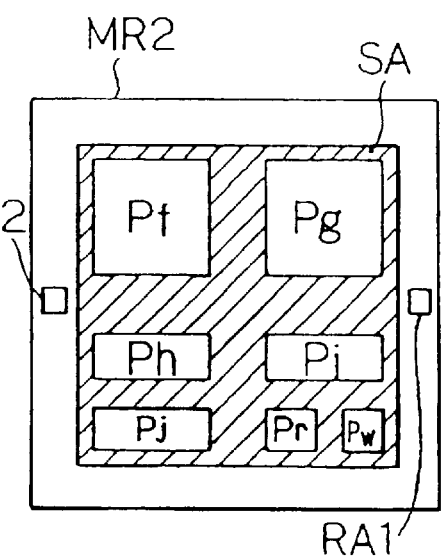

The working reticle WR in this example is produced by forming a thin film of a mask material on a predetermined substrate, applying a photoresist, then transferring optical images of equal magnification or reduced images of a plurality of circuit pattern units selected from the pattern areas of first and second master reticles MR1 and MR2 as parent masks shown in FIG. 13A and FIG. 13B in a predetermined layout. That is, after the transfer, the photomask is developed, and etching is performed for resist separation with the remaining resist pattern as a mask, thus forming the original pattern and patterns Pr shown in FIG. 13C. Although the same is true of the working reticle WR1 in FIG. 13D, the original pattern of the working reticle WR1 differs from that of the working reticle WR.

In this case, as shown in FIG. 13B, a circuit pattern unit Pa equivalent to a CPU (Central Processing Unit), a circuit pattern unit Pb equivalent to an SRAM (Static Random Access Memory), a circuit pattern unit Pc equivalent to a memory access controller and other circuit pattern units Pd and Pe as one example of a semiconductor large-scale integrated circuit (LSI) are formed in the pattern area of the first master reticle MR1. Those circuit pattern units are separated from one another by a light-shielding film SA, and a pair of alignment marks RA1 and RA2 are so formed as to sandwich the pattern area.

As shown in FIG. 13B, a circuit pattern unit Pf equivalent to a ROM (Read Only Memory) as an LSI, a circuit pattern unit Pg equivalent to a DRAM (Dynamic Random Access Memory), and circuit pattern units Ph, Pi and Pj equivalent to a gate array, which is a collection of an NAND gates or NOR gates having two to four terminal inputs, are formed in the pattern area of the second master reticle MR2. Also formed in the pattern area of the master reticle MR2 are a circuit pattern unit Pr which becomes an alignment mark for a working reticle and a circuit pattern unit Pw which becomes a wafer mark. In this master reticle MR2 too, those circuit pattern units are separated from one another by a light-shielding film SA, and a pair of alignment marks RA1 and RA2 are so formed as to sandwich the pattern area.

Figure 13C:
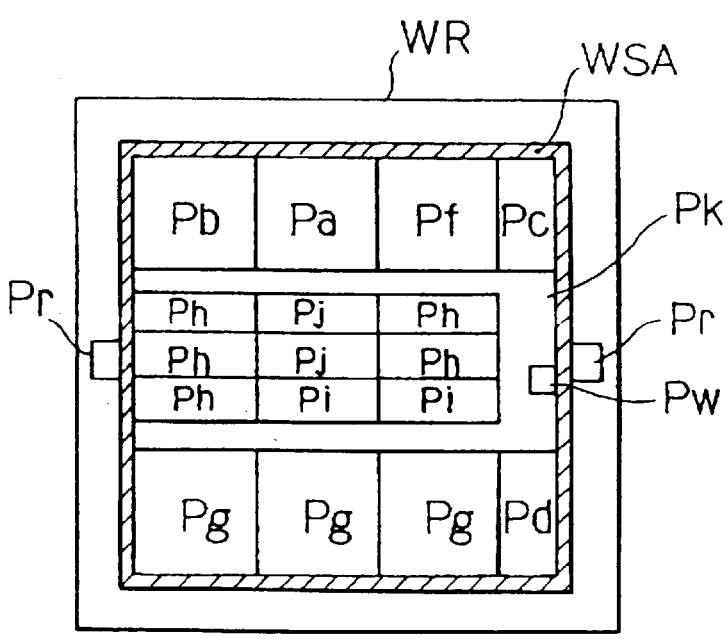
Figure 13D:
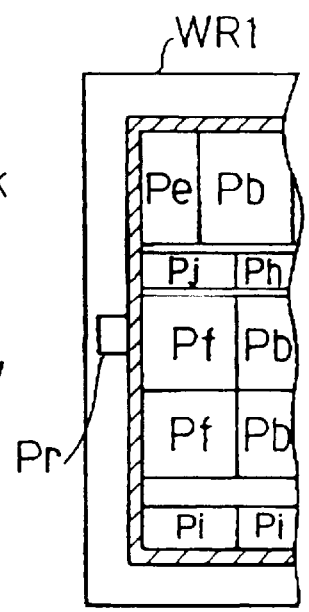

In this case, patterns Pb, Pf, Pj, . . . in the pattern areas of the working reticles WR, WR1 in FIG. 13C and FIG. 13D represent images of the circuit pattern units Pb, Pf, Pj, . . . in the master reticles MR1 and MR2 in FIG. 13A and FIG. 13B projected at a magnification of $1/\alpha$ ($\alpha$ being 1, an integer greater than 1 or a half integer or the like greater than 1). $\alpha$ is desirably an integer greater than 1 or a half integer greater than 1, such as 4, 5 or 6. In this case, the patterns Pb, Pf, Pj, . . . in FIG. 13C and FIG. 13D are the reduced images of the circuit pattern units Pb, Pf, Pj, . . . in FIG. 13A and FIG. 13B.

In this example, at the time of producing multi-type and small-quantity production type devices, such as ASICs or system ICs, first, first original patterns which are the circuit patterns of those devices magnified by β are respectively designed on image data. Then, a plurality of circuit blocks which are comprised of common patterns are extracted from those first original patterns, and after circuit pattern units Pa–Pe, Pf–Pj, Pr and Pw which are those circuit pattern blocks magnified by α are formed on image data, those circuit pattern units Pa to Pw are combined to form the original patterns (second original patterns) of the master reticles MR1 and MR2 in FIG. 13A and FIG. 13B on image data. Then, in this example, the second original patterns are written on the substrate, on which a mask material and a resist are applied, by using, for example, a laser beam lithography system (or an electron beam lithography system), and then developing, etching, resist separation and so forth are carried out to thereby produce the master reticles MR1 and MR2 in FIG. 13A and FIG. 13B.

Thereafter, the projection images of predetermined patterns in the circuit pattern units in the master reticles MR1 and MR2 are respectively transferred on substrates for the master reticles WR and WR1 in such a way as to each have a predetermined positional relation (the positional relation of the first original patterns). The gist of the projection exposure apparatus that is used in this transfer will be described with reference to FIG. 14.

Figure 14:
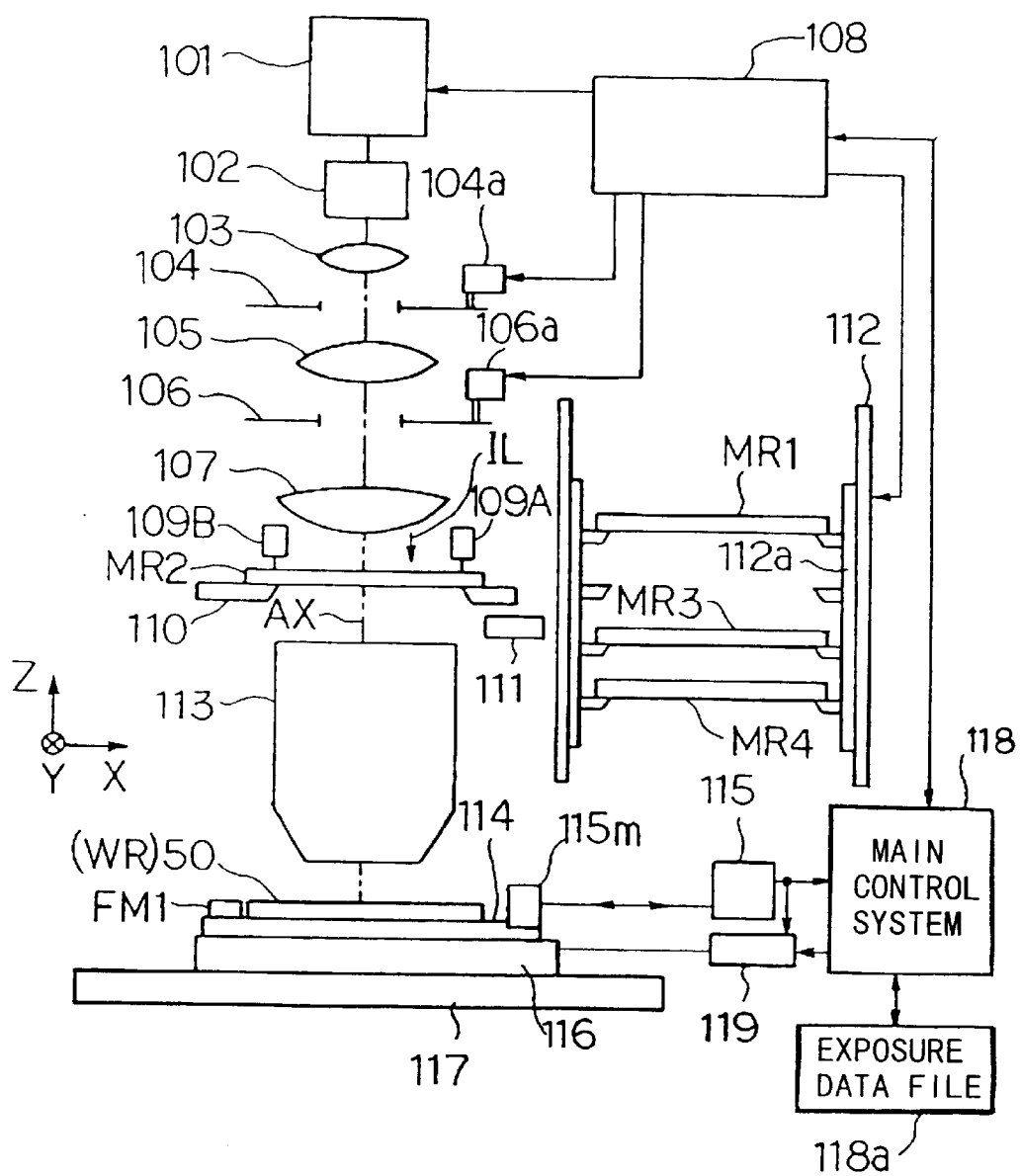
FIG. 14 is a structural diagram showing a projection exposure apparatus to be used in the embodiment shown in FIGS. 13A to 13D.

FIG. 14 shows a projection exposure apparatus for transferring the projection image of a pattern selected from a master reticle to a substrate for a master reticle. In FIG. 14, the exposure light IL that is generated from a light source, such as a mercury lamp, a KrF excimer laser (wavelength of 248 nm), an ArF excimer laser (wavelength of 193 nm) or $F_2$ laser (wavelength of 157 nm), or an exposure light source 101, such as a harmonic generator like a YAG laser, has its illuminance distribution made uniform by a uniform illuminance member 102 such as a fly-eye lens, and is then irradiated on a reticle blind (variable field stop) 104 via a lens 103. The reticle blind 104 is placed on a plane in conjugation with the pattern surface of a reticle to be exposed, and is constructed in such a way that an illumination-system control system 108 can set the shape of the opening of the reticle blind 104 to a rectangular or the like of arbitrary dimensions and set the position of that opening to an arbitrary position via a drive section 104a. A main control system 118 which performs the general control of the operation of the overall apparatus specifies the position and shape of the opening of the reticle blind 104 to the illumination-system control system 108. This can allow only the desired circuit pattern units Pa to Pw to be illuminated when the master reticles MR1 and MR2 in FIG. 13A and FIG. 13B are placed as reticles. The main control system 118 also instructs the timing of emission of the exposure light source 101 and the illumination condition of the illumination system (normal illumination, annular illumination, modified illumination or the like) and the set value of the coherence factor (σ value) to the illumination-system control system 108.

The exposure light IL that has passed through the opening of the reticle blind 104 passes a relay lens 105 and reaches an aperture stop (σ stop) 106. Because the layout surface of the aperture stop 106 can be an optical Fourier transform plane (pupil plane) to the pattern surface of a reticle, the aperture stop 106 may be arranged on the emerging surface of, for example, the uniform illuminance member 102. The illumination-system control system 108 sets the illumination condition of the exposure light IL and the coherence factor (σ value) to the ones set by the main control system 118 by changing the shape and size of the aperture stop 106 via the drive section 106a. The exposure light IL that has passed the aperture stop 106 travels through a condenser lens 107 and illuminates an illumination area 52 (see FIG. 15) which surrounds a to-be-transferred circuit pattern unit in the reticle on a reticle stage 110 (the master reticle MR2 mounted in this example).

The transmission light of the master reticle MR2 forms an image of the selected circuit pattern unit on the master reticle MR2 a projection magnification of 1/α (α being an integer greater than 1 or a half integer or the like greater than 1) on a substrate 50 for the working reticle WR, which is a substrate to be exposed by a projection optical system 113. A mask material is formed on a pattern area 55 (see FIG. 15) on the substrate 50 and a photoresist is applied in such a way as to cover the mask material. In the following description, the Z axis is parallel to the optical axis AX of the projection optical system 113, the X axis is parallel to the surface of the sheet of FIG. 14 in the plane perpendicular to the Z axis and the Y axis is perpendicular to the surface of the sheet of FIG. 14.

At this time, the reticle stage 110 positions the master reticle MR2 in the X direction, the Y direction and the rotational direction. The position of the reticle stage 110 is measured with a high accuracy by a not-illustrated laser interferometer, and the main control system 118 controls the operation of the reticle stage 110 based on this measured value. Arranged above the alignment marks RA1 and RA2 (see FIG. 13B) of the master reticle MR2 are reticle alignment microscopes 109A and 109B whose detection signals are supplied to the main control system 118.

The substrate 50 is held on a not-illustrated substrate holder by a vacuum, and this substrate holder is fixed on a sample table 114 which is secured onto an XY stage 6. The sample table 114 aligns the surface of the substrate 50 with the image surface of the projection optical system 113 by controlling the focus position (the position along the optical axis AX) of the substrate 50 and the inclination angle by the auto-focus system based on the result of the detection by a not-illustrated auto-focus sensor. The XY stage 116 positions the sample table 114 (substrate 50) in the X direction and the Y direction on a base 117 by, for example, a linear motor system.

Figure 15:
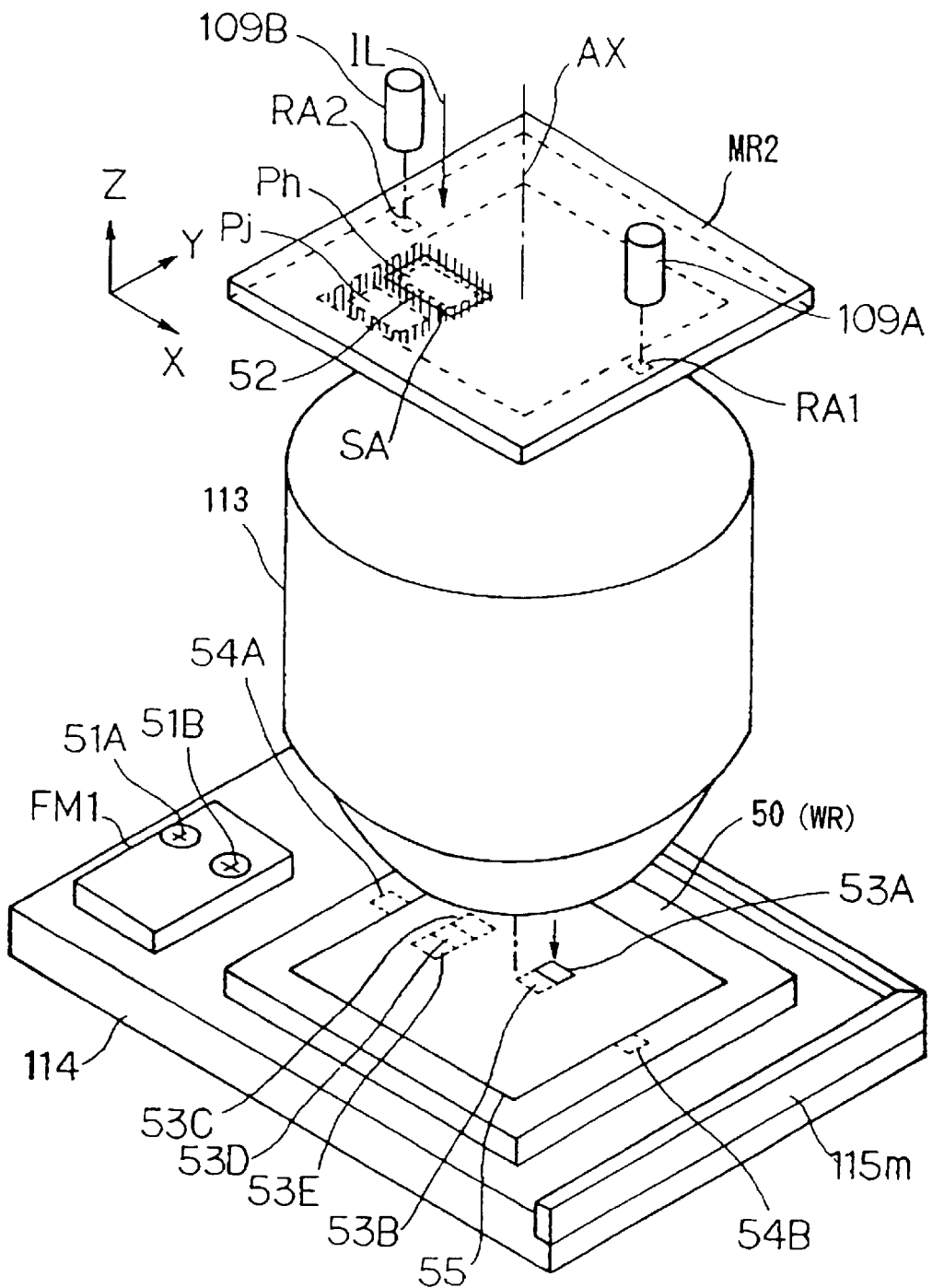
FIG. 15 is a perspective view of the essential portions of the projection exposure apparatus in FIG. 2 illustrating the case where a predetermined circuit pattern unit is transferred onto a substrate.

The X coordinate, Y coordinate and rotational angle of the sample table 114 are measured by a moving mirror 115m fixed on the upper end of the sample table 114 and a laser interferometer 115 located opposite thereto, and the measured values are supplied to a stage control system 119 and the main control system 118. The stage control system 119 controls the operation of a linear motor or the like of the XY stage 116 based on the measured values and the control information from the main control system 118. Further, a reference mark member FM1 is fixed onto the sample table 114, and two-dimensional reference marks 51A and 51B which are illuminated with the illumination light of the same wavelength band as that of the exposure light IL from, for example, the bottom, are formed on the reference mark member FM1 as shown in FIG. 15.

In FIG. 14, in this example, a reticle library 112 is located by the reticle stage 110, and the master reticles MR1, MR2, MR3 and MR4 are placed on a shelf 112a arranged movably in order in the Z direction in the reticle library 112. It is to be noted that in FIG. 14 the second master reticle MR2 is placed on the reticle stage 110. Of those master reticles, the master reticles MR1 and MR2 are the master reticles in FIG. 13A and FIG. 13B. The shelf 112a in the reticle library 112 is movable to a desired position in the Z direction under the control of the illumination-system control system 108, and a reticle loader 111 having an arm rotatable and movable in a predetermined range in the Z direction is located between the reticle stage 110 and the reticle library 112. The illumination-system control system 108 is constructed in such a way that after adjusting the position of the shelf 112a of the reticle library 112 in the Z direction, it controls the operation of the reticle loader 111 so that a desired master reticle MR1–MR4 in the reticle library 112 can be exchanged with the reticle stage 110.

Connected to the main control system 118 is a memory unit 118a, such as a magnetic disk drive, in which an exposure data file is stored. Recorded in the exposure data file are the mutual positional relation and alignment information of the individual circuit pattern units in the master reticles MR1 and MR2 and the mutual positional relation and alignment information or the like of their projection images within the working reticles WR and WR1.

One example of an exposure sequence for the substrate 50 for the working reticle WR will now be discussed.

In FIG. 14, when the master reticle MR1 is loaded on the reticle stage 110 first, the centers of the reference marks 51A and 51B (see FIG. 15) of the reference mark member FM1 are moved to the center of the exposure area of the projection optical system 113 (optical axis AX). Then, the reticle alignment microscopes 109A and 109B measure the amounts of positional deviation of the alignment marks RA1 and RA2 on the master reticle MR1 with respect to the reference marks 51A and 51B, and align the master reticle MR1 via the reticle stage 110 in such a manner that, as one example, those amounts of positional deviation become nearly symmetric and are minimized.

Subsequently, the reticle blind 104 is so set as to illuminate only, for example, the circuit pattern unit Pa in FIG. 13A. Then, the XY stage 116 is so moved as to set the position of the projection image of the circuit pattern unit Pa to the designed position on the working reticle WR in FIG. 13C, the shutter in the exposure light source 101 is opened or closed or the laser beam source is oscillated to illuminate the circuit pattern unit Pa, thus exposing the projection image of that pattern on the substrate 50.

Next, the reticle blind 104 is set again so as to illuminate only the circuit pattern unit Pb, the XY stage 116 is moved so that the position of the projection image of the circuit pattern unit Pb becomes the designed position on the working reticle WR, and exposure is carried out again. Thereafter, the circuit pattern units Pc and Pd on the master reticle MR1 are exposed in a similar manner in order. Further, it is desirable to optimize the illumination conditions (normal illumination, annular illumination, modified illumination, the σ value or the like) and the exposure conditions (the numerical aperture and the exposure amount of the projection optical system 113, the use of the so-called flex method which shifts the surface of the substrate 50 in the Z direction in relative to the image plane of the projection optical system 113, etc.) depending on whether the patterns of the circuit pattern units Pa to Pd are cyclic patterns or isolated patterns or the like. For example, annular illumination may be used for cyclic patterns, and the flex method may be used at the same time for isolated patterns.

Next, exposure using the master reticle MR2 which has different circuit pattern units is performed. The reticle loader 111 in FIG. 14 loads the master reticle MR1 outs to the reticle library 112 from the reticle stage 110 and loads the master reticle MR2 onto the reticle stage 110 instead. Thereafter, alignment of the master reticle MR2 is carried out by using the reference mark member FM1 and the reticle alignment microscopes 109A and 109B as done for the master reticle MR1.

After alignment is completed, the reticle blind 104 is set again so as to illuminate only the circuit pattern unit Pf, the XY stage 116 is moved so that the position of the projection image of the circuit pattern unit Pf becomes the designed position on the working reticle WR, and exposure is carried out again. Thereafter, exposure of the circuit pattern units on the master reticle MR2 is sequentially executed in a similar manner.

For instance, as shown in FIG. 15, when the illumination area 52 is so set as to surround the circuit pattern unit Ph on the master reticle MR2, there are five designed projection positions for the circuit pattern unit Ph on the working reticle WR as apparent from FIG. 13C. By driving the XY stage 116 in FIG. 14, therefore, five to-be-exposed areas 53A to 53E on the substrate 50 are sequentially moved to the position of the projection image of the circuit pattern unit Ph to execute exposure as shown in FIG. 15. Further, the images of the circuit pattern units Pr equivalent to the alignment marks in the master reticle MR2 are respectively exposed on two to-be-exposed areas 54A and 54B which sandwich the pattern area 55 on the substrate 50 in the X direction, and the image of the circuit pattern unit Pw equivalent to, for example, the two-dimensional wafer mark in the master reticle MR2 is exposed in an area close to the to-be-exposed area 54B in the pattern area 55.

The selection of the individual circuit pattern units on the master reticle MR1 by the reticle blind 104 is not always made so as to select a pattern completely in the contour of each unit, and the exposure light IL may leak into an area of about 1 mm in width around the contour of each unit. To prevent the leak light, therefore, the light-shielding film (light-shielding band) SA comes between the individual circuit pattern units on the master reticle MR1.

After the above-described exposure is carried out, the photoresist applied on the substrate 50 is developed, and the light-shielding film of chromium or the like on the substrate 50 is etched (patterned) to conduct resist separation or the like with the formed resist pattern used as a mask, thus completing the working reticle WR in FIG. 13C. A light-shielding band (light-shielding film) WSA is left around the circuit patterns on the working reticle WR (the patterns formed by the aforementioned exposure) in order to prevent sensitization from being caused by the leakage of the exposure light at the reticle blind when a stepper or the like is used.

If the photoresist to be used is of the positive type, therefore, it is unnecessary to expose the portion where the light-shielding band WSA is to be formed, but if it is of a negative type, the portion where the light-shielding band WSA is to be formed should be exposed. When a negative photoresist is in use, therefore, the exposure time can be shortened by forming a pattern having a "rectangular opening" to efficiently expose the portion of the light-shielding band WSA on one of the master reticles MR1–MR4 and exposing the image of the rectangular opening.

The working reticle WR1 which is partially shown in FIG. 13D can be produced by exposing the projection image of a circuit pattern unit selected from the master reticles MR1 and MR2 at a predetermined positional relation. The production of different types of working reticles WR and WR1 using the same master reticles MR1 and MR2 this way can shorten the projection time for a single working reticle and can further reduce the projection cost.

Although the patterns of the working reticles WR, WR1 are completed by combining the circuit pattern units that are selected from the two master reticles MR1 and MR2 in the third embodiment in FIG. 13, the number of the master reticles is not limited to two but any number may be used. Further, it is unnecessary to expose all of the circuit pattern units on each master reticle on the working reticle WR or WR1, but the necessary circuit pattern units alone should be selected from each master reticle and transferred and exposed at predetermined locations on the working reticle WR, WR1.

It is desirable that the projection magnification (1/α) of the projection optical system 113 in FIG. 14 should be a reduction magnification so that patterns on the master reticle MR1, MR2 are reduced and projected on the working reticle WR, WR1. This is because the reduction transfer by the projection optical system 113 can reduce the adverse effects of the dimensional precision and positional precision at the time of writing patterns on the master reticle MR1, MR2 by the reduction magnification (1/α).

A part of the working reticle WR, WR1 formed in the above-described manner may need interconnection patterns between the individual circuit blocks (an interconnection pattern Pk in FIG. 13C). As those lines are quite different between different types of products, it is difficult to employ a method of selecting and using proper patterns from common master reticles. Such a case may be addressed by additionally writing the interconnection patterns or the like on the substrate for a working reticle by using a laser beam lithography system, an electron beam lithography system or the like. In this respect, the projection exposure apparatus in FIG. 14 has a writing mechanism for additionally writing desired patterns.

Figure 16:
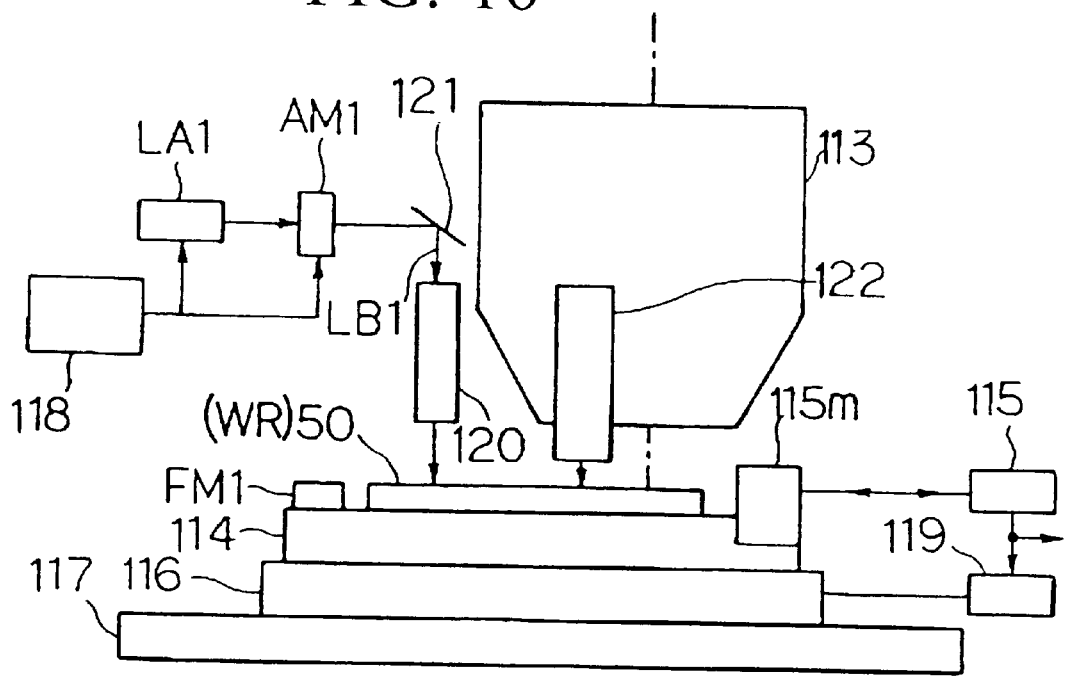
FIG. 16 is a structural diagram exemplifying a writing mechanism provided in the projection exposure apparatus in FIG. 2.

FIG. 16 shows the writing mechanism of the projection exposure apparatus in FIG. 14, and in FIG. 16, a laser beam writing mechanism is provided in the vicinity of the side surface of the projection optical system 113. Specifically, a light flux LB1 that is emitted from a laser beam source LA1 forms a spot beam on the substrate 50 for the working reticle WR via a modulation element AM1 having an electro-optic element or the like, a mirror 121 and a condensing lens 120. The modulation element AM1 is, as one example, an intensity modulating element which is a combination of Pockels cell, a polarizer and an analyzer, and the oscillation timing of the laser beam source LA1 and the operation of the modulation element AM1 are controlled by the main control system 118. The main control system 118 can permit writing of desired interconnection patterns or the like by changing the intensity of the spot beam formed by the light flux LB1 by performing the oscillation of the laser beam source LA1 or the modulation of the modulation element AM1 in synchronism with the movement of the writing area on the substrate directly under the condensing lens 120 via the XY stage 116.

In this case, because it is necessary to match the positional relation between the projection image of each circuit pattern unit in the master reticle MR1, MR2 to be transferred by the projection optical system 113 and the spot beam of the light flux LB1, it is desirable to measure the positional relation between both by using, for example, the reference mark member FM1 prior to writing.

Alternatively, an alignment sensor 122 of, for example, an image processing type may be provided on the side surface of the projection optical system 113 so that the position of the projection image of each circuit pattern unit in the master reticle MR1, MR2 transferred by the projection optical system 113 is detected by the alignment sensor 122, and the spot beam may be aligned with that position. To detect the position of the projection image of each circuit pattern unit, a latent image (a change in transmittance or refractive index of the resist's photosensitive portion in an undeveloped state) may be detected or the substrate 50 after being subjected to development may be placed in the exposure system again to detect the concave and convex resist images.

The number of the working reticles that require interconnection patterns between the individual circuit pattern units is merely about 3 to 4 (reticles corresponding to a later metal interconnecting step) of the total number (about 20). While the writing mechanism in FIG. 16 is of a stage scanning type and has a slow writing speed, the time required for laser beam lithography using that writing mechanism is short compared with the time for exposing all the substrates for the necessary number of working reticles and the effect on the overall throughput is not large. To carry out the laser beam lithography quickly, the mechanism of a laser beam lithography system to be described later, shown in FIG. 17, which also uses beam scanning, should be employed.

The line width of such interconnection patterns between the circuit pattern units are generally thicker than that of patterns in circuit pattern units and even direct writing by the laser beam lithography system does not raise any problem of dimensional precision.

A description will now be given of one example of a method of producing the master reticles MR1 and MR2 in FIG. 13A and FIG. 13B. The master reticles MR1 and MR2 can be produced by a reticle writing system, which has conventionally been used typically, such as a laser beam lithography system or an electron beam lithography system.

Figure 17:
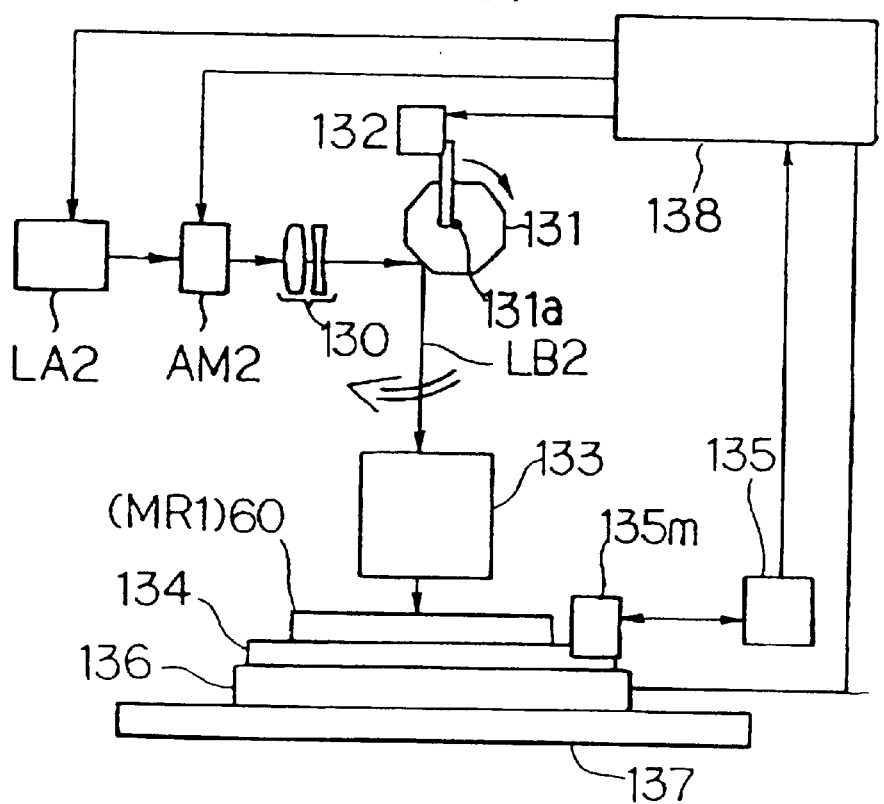
FIG. 17 is a schematic structural diagram showing a laser beam lithography system for writing the pattern of a master reticle MR1.

FIG. 17 exemplifies a reticle writing system (laser beam lithography system) which uses a laser beam. In FIG. 17, a substrate 60 for the master reticle MR1 is held on a sample table 134 which is secured onto an XY stage 136. The XY stage 136 positions the sample table 134 (substrate 60) on a base 137 in the two-dimensional direction and rotational direction. The position of the sample table 134 is measured by a moving mirror 135m on the sample table 134 and a laser interferometer 135 located opposite thereto, and a control unit 138 controls the positioning of the XY stage 136 based on the measured value.

A light flux LB2 for pattern formation, which has been emitted from a laser beam source LA2, is reflected at a polygon mirror 131 via a modulation element AM2 for modulating the intensity and a shaping optical system 130, and then forms a spot beam on the substrate 60 for the master reticle MR1 by means of an objective lens 133. Coated on the substrate 60 is a mask material on which a photoresist is applied. The control unit 138 controls the oscillating operation of the laser beam source LA2 and the modulating operation of the modulation element AM2. Further, the control unit 138 can rotate the polygon mirror 131 around a rotational axis 131a and cyclically vibrate it around a predetermined axis parallel to the surface of the sheet of FIG. 17 via a rotating drive section 132.

The control unit 138 can write a desired two-dimensional pattern by modulating the laser beam source LA2 or the modulation element AM2 in synchronism with the two-dimensional rotation of the polygon mirror 131 to two-dimensionally scan within the field of view of the objective lens 133 with the light flux LB2. Write data which indicates the shapes and the positional relations of the individual circuit pattern units pa-Pe to be written is stored in a not-illustrated memory unit, such as a magnetic disk drive, connected to the control unit 138. The control unit 138 writes the individual circuit pattern units on the substrate 60 by modulating the laser beam source LA2 or the modulation element AM2 and rotating the polygon mirror 131 based on the write data. It is to be noted that as the field of view of the objective lens 133 alone provides an area to write, the XY stage 136 is moved every time writing in each field of view is completed and writing is carried out while connecting patterns between the adjoining fields of view.

After the above writing, developing and etching or the like are performed to complete the master reticle MR1. The second master reticle MR2 can be produced in the same manner.

Although an electron beam lithography system can be used in forming the patterns of the master reticles MR1 and MR2, it is preferable to use the above-described laser beam lithography system from the view point of the processing performance because the processing performance (throughput) of an electron beam lithography system is generally lower than that of a laser beam lithography system. Although the laser beam lithography system is inferior to the electron beam lithography system in the dimensional precision of minute patterns, when a reduction projection optical system is used in exposing the working reticle WR, patterns on the master reticles MR1 and MR2 can be enlarged patterns of patterns on the working reticle WR so that the demand for the dimensional precision is relaxed and the problem of dimensional errors is overcome.

A description will now be given of one example of the steps of manufacturing a semiconductor device by burning predetermined circuit patterns on a semiconductor wafer by a projection exposure apparatus using the working reticle WR that is produced in the above-described embodiment. The projection exposure apparatus to be used in this example is basically the same as a reduction projection exposure apparatus of a static exposure type (stepper type) or a scanning exposure type such as a step and scan system, which has been used conventionally.

In the third embodiment, as in the first and second embodiments, the optical reduction projection exposure apparatus shown in FIG. 12 is used. At this time, in FIG. 12, the working reticle WR in FIG. 13C is held on the reticle stage instead of the working reticle 34.

Normally, at the time of forming a semiconductor device, it is necessary to form circuit patterns accurately, overlapping one on another about 20 or so times (20 or so layers) on the wafer W, and a wafer mark for the X axis and a wafer mark for the Y axis (neither shown) are provided in each shot area on the wafer W through the previous processes. As the not-illustrated alignment sensor detects each wafer mark, the position of an already formed circuit pattern is acquired and the pattern images of the working reticle WR are exposed on this circuit pattern, accurately overlapped one on another. The wafer mark is that pattern equivalent to the patterns Pw in, for example, the working reticle WR in FIG. 13C which has been transferred through the previous processes.

Each shot area 48 of the wafer W is positioned by using the alignment sensor. At this time, the alignment result is corrected by a certain predetermined amount (base line amount). As exposure light IL1 is irradiated on the pattern area of the working reticle WR, an image obtained by reducing the original pattern in the pattern area by the reduction magnification of $1/\beta$ is exposed in a shot area 44. After the reduced image of the original pattern of the working reticle WR is exposed in each shot area on the wafer W this way, the wafer W is developed and a process, such as etching, is carried out to form the circuit pattern of a certain layer of the semiconductor device in each shot area on the wafer W.

By the way, a recent trend in the market of devices, such as semiconductor integrated circuits, is changing towards multi-type and small-quantity production type devices, called ASICs (Application Specific ICs) or system LSIs, so that the kinds of devices to be produced in a semiconductor factory have increased considerably.

Particularly, ASICs called "standard cells" the demand for which is expected to increase in the future need reticles for coping with the 20 or so exposure steps for each kind of device. The standard cell is an ASIC which is designed by a device user by arbitrarily combining circuit units (standard cells) that have been prepared in advance by a device maker. Because the user is free to select the types of circuit units, the patterns of the working reticles quite differ from one kind to another.

Of course, as the dimensional precision demanded for each reticle has been severe, it was conventionally necessary to write each reticle with an electron beam lithography system having a low throughput while having a high accuracy.

Since the pattern shape of each standard cell itself is constant regardless of the kind, however, when the above-described embodiment is adapted to the production of working reticles for standard cells, patterns (circuit pattern units) of the individual standard cells that a device user selects should be preformed on the master reticle MR1, MR2 or the like, the standard cells (circuit pattern units) selected by the device user should be selected from the master reticles MR1, MR2 and transferred onto the substrates for the working reticles WR, WR1, etc.

The above-described embodiment significantly shortens the time needed to write the original pattern of a working reticle which has conventionally been done with an electron beam lithography system for each kind, so that the time required for the development of each kind of device can be shorted considerably. As discussed above, circuit pattern units can be written on each master reticle MR1, MR2 for producing a working reticle with a high-throughput laser beam lithography system. Further, in producing standard cells, for example, writing on the master reticle MR1, MR2 has only to be carried out once before a device maker publicizes them (starts accepting orders for them) as standard cells to a device user, so that the effect on the total throughput or the read time is equivalent to nil.

Of course, the time needed to produce (expose and transfer) the working reticle WR from the master reticle MR1, MR2 is about 1 hour at maximum per working reticle, so that the time needed to produce working reticles for manufacturing devices can be shortened dramatically.

The method of manufacturing a working reticle in this example is not limited to the method of previously producing master reticles and selecting and transferring some of their patterns on a substrate for the working reticle, but it does not matter at all if some or all of the master reticles are newly produced for each new kind of device and working reticles are produced by using those new master reticles. This method is advantageous in that it can cope with interconnections that differ from one kind to another more flexibly.

When the reduction ratio from the master reticle MR1, MR2 to the working reticle WR is large, there may be a case in which it is hard to form a single circuit pattern unit Pa, Pf or the like on a single master reticle MR1, MR2 at a time.

In this case, it is needless to say that the circuit pattern unit should be separated and written on two or more master reticles, and they should be connected together to form a single circuit pattern unit at the time they are transferred to the working reticle WR.

Although the projection exposure apparatus of a static exposure type (stepper type) is used as an exposure system which exposes the pattern of a master reticle on the substrate 50 for the working reticle WR in FIG. 14, a projection exposure apparatus of a scanning exposure type such as a step and scan system may be used instead.

In the above-described embodiments, the reduced images of a plurality of parent patterns are transferred, linked together, on the substrate for a working reticle. Although the boundary between two adjoining shot areas on the substrate where the reduced images of the parent patterns are respectively transferred is a straight line at this time, the boundary portion may be made irregular so that, for example, no pattern which stretches over the two shot areas exists as much as possible. In this case, a pattern which stretches over the two shot areas, i.e., the connecting portion of the reduced images of the parent patterns can be reduced significantly, thus improving the production precision of working reticles. The exposure method in which the boundary portion between two adjoining shot areas is not a straight line is disclosed in, for example, Japanese Unexamined Patent Application, First Publication No. 9-190962 and its corresponding U.S. patent application Ser. No. 08/781,105 (the date of application: Jan. 9, 1997), and the disclosures in this publication and the U.S. patent are incorporated herein by reference as a part of the present description within what is permitted by the domestic laws of the country specified or selected in this international application. As apparent from the above-described third embodiment, even if there is no pattern which stretches over two adjacent shot areas on a substrate, i.e., even if there is no connecting portion between the reduced images of two parent patterns, this invention uses such a representation in which the reduced images of two parent patterns to be respectively transferred to the two shot areas are connected together. Therefore, the screen linking of reduced images in this invention is carried out irrespective of whether or not there is a connecting portion, and uses the concept of transferring the reduced images of two parent patterns, one adjacent to the other.

The projection exposure apparatus for producing a photomask (FIG. 2, FIG. 14, etc.) which transfers a parent pattern on a master reticle onto a substrate for a working reticle may use a rod integrator instead of a fly-eye lens as an optical integrator (homogenizer) which is located in the illumination optical system, or a fly-eye lens may be combined with a rod integrator. Further, the projection optical system may be any of a refraction system comprising only a plurality of refractive optical elements, a reflection system comprising only a plurality of reflection optical elements and a reflection/refraction system comprising a refractive optical element and a reflection optical element. The projection optical system of a reflection/refraction type may be any of an optical system which has at least a beam splitter and a concave mirror as reflection optical elements, an optical system which has a concave mirror and a mirror without using a beam splitter as reflection optical elements, and an optical system which has a plurality of refraction optical elements and two reflection optical elements (at least one of which is a concave mirror) arranged, without being bent, on the optical axis that extends straight, as disclosed in U.S. Pat. No. 5,788,229. The disclosure in this U.S. patent is incorporated herein by reference as a part of the present description within what is permitted by the domestic laws of the country specified or selected in this international application.

Although the illumination condition, i.e., the intensity distribution of exposure light on the Fourier transform plane (pupil plane), is changed by using the aperture stop in the above-described embodiment, the structure may be so made as to change the intensity distribution of the illumination light on the incident surface of an optical integrator by moving at least one optical element arranged between, for example, the exposure light source and the optical integrator. A pair of conical prisms (axicons) may further be arranged closer to the light source side than that at least one optical element, and adjusting the distance between the pair of axicons along the optical axis can change the illumination light on the incident surface of the optical integrator to such an annular shape that the center of the intensity distribution is higher than the outer side. This makes it possible to change the intensity distribution of the illumination light on the emerging-side focus plane of the fly-eye lens and on the Fourier transform plane of the illumination optical system that is set between the emerging surface of the rod integrator and a reticle, and considerably decrease the light loss of the illumination light that is caused by a change in the illumination condition, so that high throughput can be maintained.

A projection exposure apparatus that uses, as illumination light for exposure, EUV (Extreme Ultra Violet) light of a soft X-ray range (wavelength of about 5 to 15 nm) having, for example, a wavelength of 13.4 nm or 11.5 nm, which is generated from a laser plasma light source or SOR may be used as an exposure system for producing the above-described photomask. In the EUV exposure apparatus, the reduction projection optical system is a reflection system which comprises only a plurality of (about 3 to 6) reflection optical elements and a reflection type mask is used as a parent mask.

Further, a harmonic, which is acquired by amplifying a single-wavelength laser of an infrared range or a visible range, which is emitted from a DFB semiconductor laser or a fiber laser, by a fiber amplifier in which, for example, erbium (or both erbium and yttrium) is doped, and then subjecting it to wavelength conversion to ultraviolet light by using a non-linear optical crystal, may be used as illumination light for exposure. As one example, when the oscillation wavelength of a single-wavelength laser is set in a range of 1.51 to 1.59 μm, an 8× harmonic whose generated wavelength is in a range of 189 to 199 nm, or a 10× harmonic whose generated wavelength is in a range of 151 to 159 nm is output. If the oscillation wavelength is set in a range of 1.544 to 1.553 μm, particularly, an 8× harmonic in a range of 193 to 194 nm, i.e., ultraviolet light whose wavelength becomes approximately the same as that of an ArF excimer laser is acquired, and if the oscillation wavelength is set in a range of 1.57 to 1.58 μm, a 10× harmonic in a range of 157 to 158 nm, i.e., ultraviolet light whose wavelength becomes approximately the same as that of an F2 laser is acquired.

As a projection exposure apparatus for producing devices, which uses DUV light (Deep Ultra Violet light), VUV light (Vacuum Ultra Violet light) or the like generally uses transmission type reticles, quartz glass, fluorine-doped quartz glass, fluorite, magnesium fluoride, quartz crystal or the like is used as a substrate for a working reticle in each of the above-described embodiments. As the EUV exposure apparatus uses a reflection type mask, the proximity type X-ray exposure apparatus or a mask projection type electron beam lithography system or the like uses a transmission type mask (stencil mask, membrane mask), a silicon wafer or the like is used as a substrate for a working reticle.

Note that the projection optical system having a plurality of optical elements assembled in the lens-barrel and at least a part of the illumination optical system which comprises multiple optical elements (including an optical integrator, etc.) are secured to a frame which is supported by a vibration isolator which has three or four vibration isolating pads and is arranged on the base plate. Further, the substrate stage is located on the base which is placed on that frame and the base where the reticle stage is placed is secured to a column provided on that frame. Then, the optical adjustment of each of the illumination optical system and the projection optical system is performed, lines and pipes are connected to the reticle stage and wafer stages, which comprise multiple mechanical components, and the general adjustment (electric adjustment, confirmation of the operation, etc.) is executed, which can provide the aforementioned projection exposure apparatus for producing a photomask (FIG. 2, FIG. 14, etc.). It is desirable that the manufacture of the exposure system should be carried out in a clean room whose temperature, degree of cleanness and so forth are controlled.

This invention is not limited to the above-described embodiments but may of course take various structures without departing from the spirit or scope of the invention.

Industrial Applicability

This invention relates to a method and apparatus for producing a photomask which is used as an original pattern at the time of fabricating a micro device, such as a semiconductor integrated circuit, by using lithographic technology, and a method of manufacturing a device which uses such a photomask producing method. According to the (first, second and third) photomask producing methods of this invention, each of the patterns of a plurality of parent masks is a part of an enlarged pattern of a transfer pattern, so that the patterns can be written with less write data and in a short period of time with a smaller amount of drifting by using, for example, an electron beam lithography system or a laser beam lithography system. Since the writing error for the parent masks becomes smaller by the ratio of the reduction magnification of the parent masks, it is possible to form the transfer pattern (original pattern) with high precision. Further, since those parent masks, once produced, can be used repeatedly, there is the advantage that in the case of producing multiple photomasks, each original pattern can be formed with a high precision and in a short period of time.

According to the second and third photomask producing methods of this invention, because each of the patterns of parent masks (or segment patterns) is a part of an enlarged pattern of a transfer pattern, there are the advantages that not only can the patterns be written in a short period of time with a smaller amount of drifting, but also multiple exposures can average the writing error for the patterns of parent masks by the number of multiple exposures, thereby significantly reducing the positional error, line width error or the like of the pattern of the photomask to be finally formed (original pattern) and improving the accuracy.

At the time of connecting the reduced images of patterns of parent masks (or segment patterns) on the substrate for the photomask together and exposing them, the write error of the patterns of the parent masks or the like is also reduced, so that the original pattern can be formed with high precision.

When the segmentation method for the patterns of at least one set of plural parent masks in the patterns of M sets of plural parent masks differs from that for another predetermined set of plural parent masks, or at least one set of patterns of plural parent masks in the M sets of patterns of plural parent masks includes a linkage area for another predetermined set of patterns of plural parent masks, images at different positions in the exposure area of the projection optical system that exposes the pattern images of the parent masks are exposed at the same position on the substrate for the photomask, so that the distortion of the projection optical system and an error in the evenness of the width of the transfer line at a position in the exposure area are reduced by the averaging effect. Therefore, the image forming characteristic of the projection exposure apparatus that is used in producing the photomask is substantially corrected. Further, the linkage error is reduced by the averaging effect.

In the case where at the time of sequentially transferring the reduced images of patterns of the plural parent masks on the surface of the substrate, a reduction projection exposure apparatus of a static exposure type or a reduction projection exposure apparatus of a scanning exposure type is selectively used in accordance with the use of the photomask, an expected error in the image forming characteristic can be corrected by previously correcting the image forming characteristic of the patterns of the parent masks in such a way as to cancel out the error or the like of the image forming characteristic that is expected in accordance with the usage.

Even in the case where at the time of sequentially transferring the reduced images of patterns of plural parent masks on the surface of the substrate, each of the image forming characteristics of the reduced images of the patterns of the parent masks is corrected in accordance with at least one of a non-rotational symmetric aberration and a distortion characteristic of the projection optical system of the projection exposure apparatus which uses the photomask, when a predetermined image forming characteristic of the projection optical system which uses the photomask is degraded, the image forming characteristic can substantially be corrected, thus improving the overlap precision or the like.

When the photomask is further used in reduction projection, the magnification of the patterns f parent masks (or segment patterns) become greater than that of the pattern of the device which is finally manufactured. This further reduces the effect of the writing error of an electron beam lithography system or the like which writes the patterns of the parent masks, so that the pattern of the device can be formed with a higher precision.

In the case where a combination of the images of pattern units selected from the patterns of parent masks is transferred, various kinds of photomasks (working reticles) can be produced in a short period of time with little use of a laser beam lithography system, an electron beam lithography system or the like. This provides the advantage that photomasks which can be used at the time of manufacturing devices of a many-types and small-quantity production type, such as ASICs and LSIs, can be produced in a short period of time and at a low cost.

Since working reticles can be produced in a short period of time, there is the advantage of being able to shorten the developing period for devices, such as ASICs.

Further, the photomask producing apparatus of this invention can implement the photomask producing method of this invention.

Furthermore, as the device manufacturing apparatus of this invention employs the photomask producing method of this invention, the pattern of a device can be formed with a high precision.

The method of manufacturing a device by transferring a combination of the images of pattern units selected from the patterns of parent masks has the advantage that devices of multi-type and small-quantity production type can be manufactured in a short period of time.

What is claimed is:

1. A method of producing a photomask which is to be used in an exposure apparatus and on which a transfer pattern is formed, comprising:

providing patterns of plural parent masks which are formed by segmenting an enlarged pattern of said transfer pattern; and moving a substrate for said photomask so as to transfer said patterns of said plural parent masks to different positions on said substrate, and respectively transferring a reduced image of each od said patterns of said plural parent masks onto said substrate by means of a different exposure apparatus, which is different from said exposure apparatus, for forming said reduced image of said pattern for each parent mask using light as an exposure beam.

2. The photomask producing method according to claim 1, wherein a reduction projection exposure apparatus of a static exposure type or a reduction projection exposure apparatus of a scanning exposure type is selectively used as said different exposure apparatus in accordance with the use of said photomask.

3. The photomask producing method according to claim 1, wherein each image forming characteristic of the reduced images of said patterns of said parent masks is corrected in accordance with at least one of a rotational asymmetric aberration and a distortion characteristic of a projection optical system of said different exposure apparatus.

4. The photomask producing method according to claim 1, wherein said photomask is further used in reduction projection of said transfer pattern onto a photosensitive object by means of said exposure apparatus.

5. A method of producing a photomask which is used in an exposure apparatus and on which a transfer pattern is formed, comprising:

providing plural segmented patterns of an enlarged pattern of said transfer pattern corresponding to plural circuit blocks comprising said transfer pattern, said plural segmented patterns each including a pattern unit corresponding to each of said circuit blocks; and transferring reduced images of said plural segmented patterns onto a substrate for said photomask to different positions by means of a different exposure apparatus, which is different from said exposure apparatus, for forming a reduced image of each of said segmented patterns using light as an exposure beam.

6. The photomask producing method according to claim 5, wherein said circuit block corresponds to one of a CPU core section, RAM section and ROM section in an integrated circuit and standard circuit block for a standard cell.

7. The photomask producing method according to claim 6, wherein plural parent masks are prepared on which said plural segmented patterns are formed, and said transfer pattern is formed on said substrate using each of said plural parent masks in said different exposure apparatus.

8. The photomask producing method according to claim 7, wherein said parent mask is used at a time of producing plural types of photomasks.

9. The photomask producing method according to claim 8, wherein said photomask is further used in reduction projection of said transfer pattern onto a photosensitive object by means of said exposure apparatus.

10. The photomask producing method according to claim 5, wherein by using an exposure beam stopped down to a predetermined spot, a part of said transfer circuit pattern is written on said substrate for said photomask at at least a part of an area other than where an image of said pattern unit of said parent mask is transferred.

11. A method of manufacturing a device in which a circuit pattern is formed on an object, comprising:

providing plural parent masks formed by segmenting a second pattern obtained by further enlarging, by a magnification of $\alpha(\alpha>1)$, a first pattern of said circuit pattern, which has been enlarged by a magnification of $\beta(\beta>1)$;

producing a photomask formed with said first pattern by moving a substrate for the photomask so as to transfer patterns of said plural parent masks to different positions on said substrate and by transferring a reduced image of each of said patterns of said plural parent masks onto said substrate by means of a first exposure apparatus, which illuminates each of said plural parent masks using light as an exposure beam, having a projection system with a reduction magnification of $1/\alpha$; and forming said circuit pattern on said object by transferring a reduced image of said first pattern formed on said photomask onto said object by means of a second exposure apparatus, which is different from said first exposure apparatus, having a projection system with a reduction magnification of $1/\beta$.

12. A method of manufacturing a device in which a circuit pattern is formed on an object, comprising:

providing plural segmented patterns, in which a second pattern obtained by further enlarging by a magnification of $\alpha(\alpha>1)$ a first pattern of said circuit pattern, which has been enlarged by a magnification of $\beta(\beta>1)$, respectively corresponding to plural circuit blocks comprising said circuit pattern, wherein said plural segmented patterns each include a pattern unit corresponding to each circuit block;

producing a photomask, on which said first pattern is formed, by transferring a reduced image of said plural segmented patterns onto a substrate for the photomask to different positions by means of a first exposure apparatus, which illuminates each of said plural segmented patterns using light as an exposure beam, having a projection system with a reduction magnification of $1/\alpha$; and forming said circuit pattern on said object by transferring a reduced image of said first pattern formed on said photomask onto said object by means of a second exposure apparatus, which is different from said first exposure apparatus, having a projection system with a reduction magnification of $1/\beta$.

13. The photomask producing method according to claim 1, wherein different pattern units corresponding to circuit blocks with different functions, which constitute said transfer pattern, are respectively formed on said plural parent masks.

14. The photomask producing method according to claim 13, wherein another transfer pattern of which a part has a different circuit block from that of said transfer pattern is formed on a different photomask from said photomask by using at least one of said plural parent masks.

15. The photomask producing method according to claim 1, wherein exposure conditions are made different on at least a part of said plural parent masks.

16. A method of producing a photomask on which a pattern is transferred onto a device substrate in an exposure apparatus, comprising:

providing plural segmented patterns of said pattern; transferring said plural segmented patterns onto a mask substrate to different positions by means of a different exposure apparatus which is different from said exposure apparatus; and adjusting at least one of a transfer position and an image characteristic of said segmented patterns on said mask substrate in said different exposure apparatus based on a transfer characteristic of said pattern of said exposure apparatus.

17. The photomask producing method according to claim 16, wherein said plural segmented patterns respectively correspond to circuit blocks with different functions, which constitute said pattern.

18. The photomask producing method according to claim 16, wherein said plural segmented patterns are provided by segmenting an enlarged pattern of said pattern, and reduced images of said plural segmented patterns are transferred on said mask substrate.

19. The photomask producing method according to claim 18, wherein said image characteristics include an optical characteristic of a projection optical system for forming reduced images of said patterns.

20. A method according to claim 5, further comprising:
providing a parent mask on which a mark is formed corresponding to an alignment mark disposed with a predetermined positional relationship with respect to said transfer pattern; and forming said alignment mark on said substrate by transferring said corresponding mark using said parent mask in said different exposure apparatus.

21. A method of manufacturing a device in which a circuit pattern is formed on an object, comprising:
producing a photomask using the method according to claim 16; and transferring a reduced image of a pattern of said photomask onto said object.

22. A method for producing plural photomasks which include at least first and second photomasks having different transfer patterns that include at least one identical circuit block, comprising:
providing plural first patterns in which at least a portion of a first transfer pattern formed on said first photomask is segmented, said first transfer pattern having plural circuit blocks which include said identical circuit block in said at least a portion of said first transfer pattern and a portion of said plural first patterns including said identical circuit block;

providing at least one second pattern in which at least a portion of a second transfer pattern formed on said second photomask is segmented, said second transfer pattern having plural circuit blocks which include said identical circuit block in said at least a portion of said second transfer pattern and said at least one second pattern including a circuit block which is different from said identical circuit block;

forming said first transfer pattern on a first substrate by transferring each of said plural first patterns onto said first substrate to different positions; and forming said second transfer pattern on a second substrate by respectively transferring a first pattern corresponding to said identical circuit block among said plural first patterns and said at least one second pattern onto said second substrate to different positions.

23. A method according to claim 22, wherein said plural photomasks are each used in manufacturing a semiconductor device, and said identical circuit block includes at least one of a CPU, a memory and a gate array.

24. A method according to claim 22, further comprising:
providing a parent mask on which a mark is formed corresponding to an alignment mark disposed with a predetermined positional relationship with respect to said transfer pattern; and forming said alignment mark on each of said substrates by transferring said corresponding mark onto each of said substrates using said parent mask.

25. A method according to claim 22, wherein:
said plural first patterns and said at least one second pattern are formed on plural parent masks; and said first and second transfer patterns are respectively formed on said first and second substrates using said plural parent masks by a different exposure apparatus which is different from an exposure apparatus that uses said first and second photomasks.

26. A method according to claim 25, wherein at least one of said first and second photomasks has said transfer pattern which is to be formed on said substrate by means of a first exposure of said substrate using at least a portion of said plural parent masks and a second exposure of said substrate using a spot beam irradiated onto said substrate.

27. A method of manufacturing a device in which a circuit pattern is formed on an object, comprising:
producing plural photomasks using the method according to claim 22, and transferring a reduced image of a pattern of at least one of said plural photomasks onto said object.

28. A method according to claim 1, further comprising:
providing a different parent photomask which is different from said plural parent photomasks and on which a portion of an enlarged pattern of a transfer pattern to be formed on a separate photomask different from said photomask is formed; and transferring a reduced image of a pattern of each of said different parent photomasks and at least one of said plural parent photomasks onto a substrate for the separate photomask in order to produce said separate photomask.

29. A method according to claim 28, wherein:
a portion of a transfer pattern to be formed on said substrate photomask is identical to at least a portion of a transfer pattern to be formed on said photomask; and said different parent mask has a pattern formed thereon which is different from patterns of said plural parent masks.

30. A method according to claim 28, further comprising:
providing a parent mask on which a mark is formed which corresponds to an alignment mark disposed with a predetermined positional relationship with respect to a transfer pattern to be formed on said photomask; and forming said alignment mark on said substrate for said photomask by transferring a reduced image of said corresponding mark onto said substrate for said photomask by means of said different exposure apparatus.

31. A method according to claim 30, further comprising:
forming an alignment mark on said substrate for said separate photomask using said parent mask on which said corresponding mark is formed.

32. A method according claim 28, wherein a transfer pattern to be formed on said photomask includes a wiring pattern, and said transfer pattern is formed on said substrate for said photomask by means of a first exposure of said substrate for said photomask using said plural parent masks and a second exposure of said substrate for said photomask for transferring said wiring pattern.

33. A method according to claim 1, wherein exposure conditions of said substrate of said different exposure apparatus are different in said plural parent masks in order to respectively transfer a reduced image of a pattern of each of said plural parent masks onto said substrate.

34. A method according to claim 1, wherein an image characteristic of said different exposure apparatus which forms said reduced image of said pattern of each of said plural parent masks is adjusted in accordance with a characteristic of said exposure apparatus in order to respectively transfer said reduced image of said pattern for each parent mask onto said substrate.

* * * * *